US012772881B2

(12) United States Patent
Lin et al.

(10) Patent No.: US 12,772,881 B2
(45) Date of Patent: Oct. 20, 2026

(54) PACKAGE STRUCTURE AND METHOD FOR MANUFACTURING THE SAME

(71) Applicant: Advanced Semiconductor Engineering, Inc., Kaohsiung (TW)

(72) Inventors: Hung-Yi Lin, Kaohsiung (TW); Cheng-Yuan Kung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 631 days.

(21) Appl. No.: 18/119,272

(22) Filed: Mar. 8, 2023

(65) Prior Publication Data

US 2024/0304555 A1 Sep. 12, 2024

(51) Int. Cl.

| | |
|---|---|
| ***H10W 70/65*** | (2026.01) |
| ***H10B 80/00*** | (2023.01) |
| ***H10W 90/00*** | (2026.01) |

(52) U.S. Cl.

CPC ............ *H10W 70/65* (2026.01); *H10B 80/00* (2023.02); *H10W 90/701* (2026.01); *H10W 90/722* (2026.01); *H10W 90/724* (2026.01)

(58) Field of Classification Search

CPC ............. H01L 23/5381; H01L 23/5389; H01L 23/5384; H10W 70/65; H10W 70/611; H10W 90/401

See application file for complete search history.

(56) References Cited

U.S. PATENT DOCUMENTS

| | | | | |
|---|---|---|---|---|
| 2019/0148330 | A1 * | 5/2019 | Chen | H10P 72/74 257/774 |
| 2021/0005592 | A1 * | 1/2021 | Lee | H01L 23/5386 |
| 2022/0139880 | A1 * | 5/2022 | Lee | H01L 23/5286 257/621 |
| 2022/0208693 | A1 * | 6/2022 | Farooq | H01L 23/3157 |
| 2022/0302003 | A1 * | 9/2022 | Pan | H01L 23/5385 |
| 2022/0336332 | A1 | 10/2022 | Yen et al. | |
| 2024/0170464 | A1 * | 5/2024 | Jo | H01L 23/49822 |
| 2024/0178150 | A1 * | 5/2024 | Liu | H01L 24/16 |
| 2024/0243048 | A1 * | 7/2024 | Chang | H01L 23/49816 |

* cited by examiner

*Primary Examiner* — Michele Fan
(74) *Attorney, Agent, or Firm* — Foley & Lardner LLP

(57) ABSTRACT

A package structure and a method for manufacturing the package structure are provided. The package structure includes an interposer, a first electronic component over the interposer, and a second electronic component over the interposer. The interposer includes a first interconnector and a second interconnector. The first electronic component and the second electronic component are disposed at a first horizontal level and electrically connected to each other through the first interconnector. The second interconnector is electrically connected to a third electronic component disposed at a second horizontal level different from the first horizontal level.

15 Claims, 23 Drawing Sheets

PACKAGE STRUCTURE AND METHOD FOR MANUFACTURING THE SAME

1. TECHNICAL FIELD

The present disclosure generally relates to package structures and methods for manufacturing the same. More particularly, the present disclosure relates to package structures including a bridge component which allows for horizontal integration and vertical integration.

2. DESCRIPTION OF THE RELATED ART

In the Multi-Chip Module (MCM) package techniques, a plurality of the semiconductor dies are integrated on a substrate which provides interconnection between the plurality of the semiconductor dies. As the semiconductor technology node advances, high-density interconnection is required. It is crucial for a semiconductor package to increase the interconnection density with minimal increase in the costs. In addition, techniques are being developed to miniaturize a semiconductor package.

SUMMARY

In some arrangements, a package structure includes an interposer, a first electronic component over the interposer, and a second electronic component over the interposer. The interposer includes a first interconnector and a second interconnector. The first electronic component and the second electronic component are disposed at a first horizontal level and electrically connected to each other through the first interconnector. The second interconnector is electrically connected to a third electronic component disposed at a second horizontal level different from the first horizontal level.

In some arrangements, a package structure includes a bridge interposer, a first electronic component, a second electronic component, and a third electronic component. The bridge interposer includes an active surface, and a plurality of conductive pads and at least one conductive pillar disposed on the active surface. A height of the at least one conductive pillar is greater than a height of the plurality of conductive pads. The first electronic component and the second electronic component are disposed at a first horizontal level and electrically connected to the plurality of conductive pads. The bridge interposer is disposed under a gap between the first electronic component and the second electronic component. The third electronic component is disposed at a second horizontal level different from the first horizontal level and electrically connected to the at least one conductive pillar.

In some arrangements, a package structure includes a bridge component and a first electronic component. The bridge component includes an active surface, and a plurality of conductive pads and at least one conductive structure disposed on the active surface. The first electronic component is disposed on the bridge component and bonded to the bridge component through the plurality of conductive pads. The at least one conductive structure extends upwardly from the active surface of the bridge component and along a lateral surface of the first electronic component.

BRIEF DESCRIPTION OF THE DRAWINGS

Aspects of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
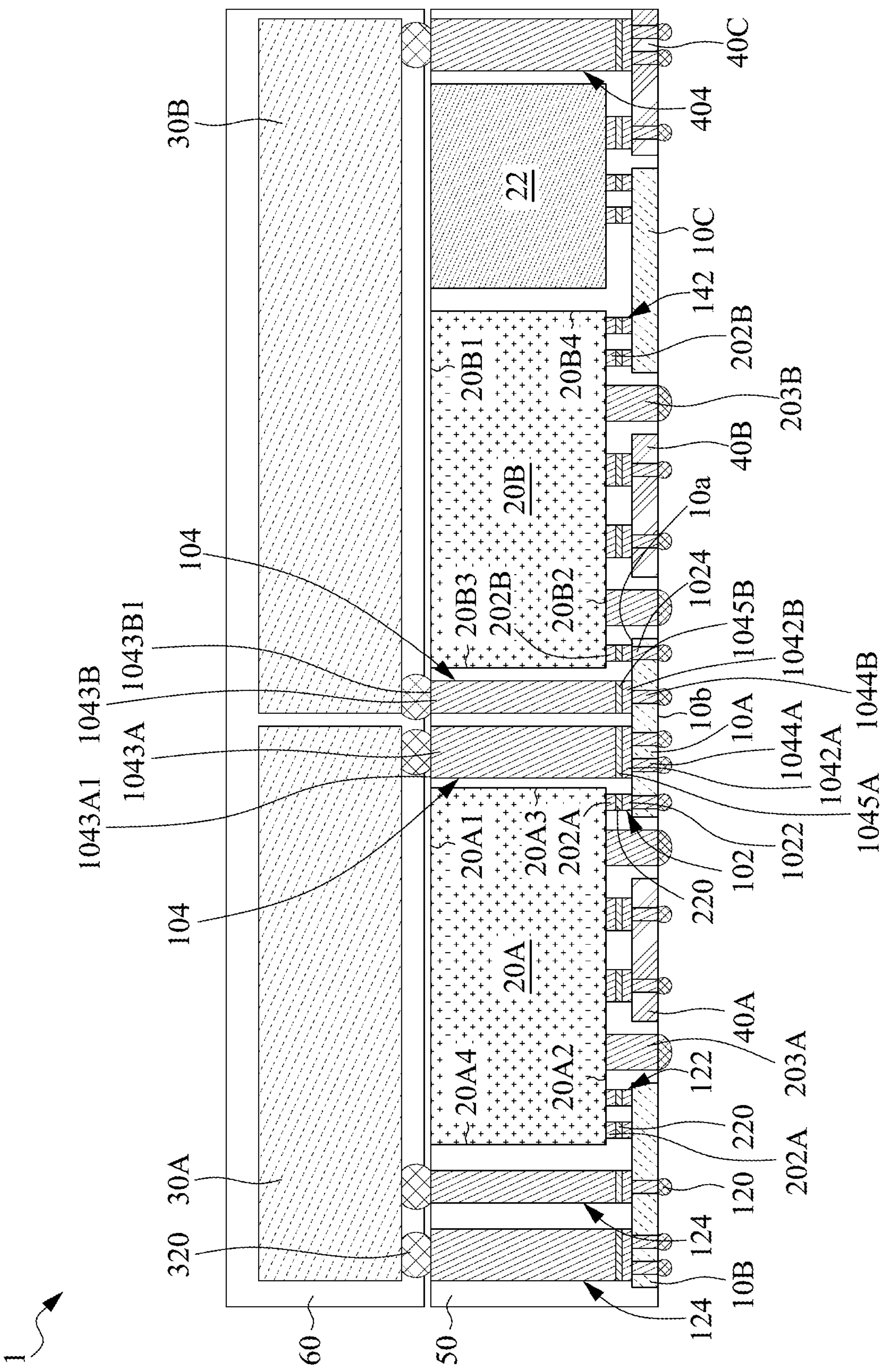
FIG. 1 illustrates a schematic cross-sectional view of a package structure in accordance with some arrangements of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

As used herein the term "active surface" may refer to a surface of an electronic component or passive component on which electrical or contact terminals such as contact pads, conductive studs or conductive pillars are disposed, for transmission of electrical signals or power. The term "inactive surface" may refer to another surface of the electronic component or passive component on which no electrical or contact terminals are disposed.

In the Multi-Chip Module (MCM) techniques, a substrate is used to provide signal connections between multiple IC dies or chips. However, due to the limitation of the line width and line spacing (L/S) of the substrate, the needs of high-density parallel I/O cannot be satisfied. In the existing techniques, redistribution layer(s) (RDL) may be applied so as to provide high-density parallel I/O. The manufacture of RDL with high-density parallel I/O requires a high-precision manufacture process, which increases manufacture cost. In addition, the RDL is formed in the package as an entire intermediate layer but only a part of the RDL requires high-density conductive lines and the other part does not have such requirement, which causes waste of costs. Although in some cases, a bridge die, rather than an entire intermediate RDL layer, is used for connection of high-density conductive lines, and tall copper pillars are disposed in the other areas for external connection of signals and power/ground (GND), at least one layer of RDL and one layer of under-bump metallization (UBM) pad are still required above the bridge die for conversion of pad pitches.

The present disclosure relates to package structures and methods for manufacturing the same. In some arrangements, the package structures include a bridge component which provides horizontal electrical connection (horizontal integration) for electronic components disposed side by side and provides vertical electrical connection (vertical integration) for electronic components stacked vertically. The bridge component can be directly bonded to the electronic components without the need of an intermediate RDL layer. The package structures of the present disclosure can reduce the costs caused by RDL and decrease the footprint of the packages.

FIG. 1 illustrates a schematic cross-sectional view of a package structure 1 in accordance with some arrangements of the present disclosure. The package structure 1 may be a semiconductor package structure. The package structure 1 may include a bridge component 10A, an electronic component 20A, an electronic component 20B, an electronic component 30A and/or an electronic component 30B.

The bridge component 10A may be or include a bridge die. The bridge component 10A may be or include an interposer (also referred to as a bridge interposer). The bridge component 10A may include a redistribution layer (RDL) which may be electrically connected to a conductive pad(s), a conductive pillar(s) and/or a conductive through via(s) of the bridge component 10A. The bridge component 10A has a surface 10*a* and a surface 10*b*. The surface 10*a* may be an active surface of the bridge component 10A. The surface 10*b* is opposite to the surface 10*a* and may be referred to as a backside surface. The bridge component 10A may be disposed below or under the electronic component 20A and the electronic component 20B. The bridge component 10A may be disposed below or under a gap (not denoted) between the electronic component 20A and the electronic component 20B. The bridge component 10A may electrically connect the electronic component 20A and the electronic component 20B. A projection of the bridge component 10A in a vertical direction may partially overlap the electronic component 20A and partially overlap the electronic component 20B. A portion of the projection of the bridge component 10A in a vertical direction may not overlap the electronic component 20A or the electronic component 20B. A portion of the projection of the bridge component 10A in a vertical direction may lie in the gap 262. The bridge component 10A may include an interconnector structure 102 and an interconnector structure 104. The interconnector 102 may be configured for horizontal transmission or connection (e.g., horizontal electrical transmission or connection). The interconnector 104 may be configured for vertical transmission or connection (e.g., vertical electrical transmission or connection).

Figure 2:
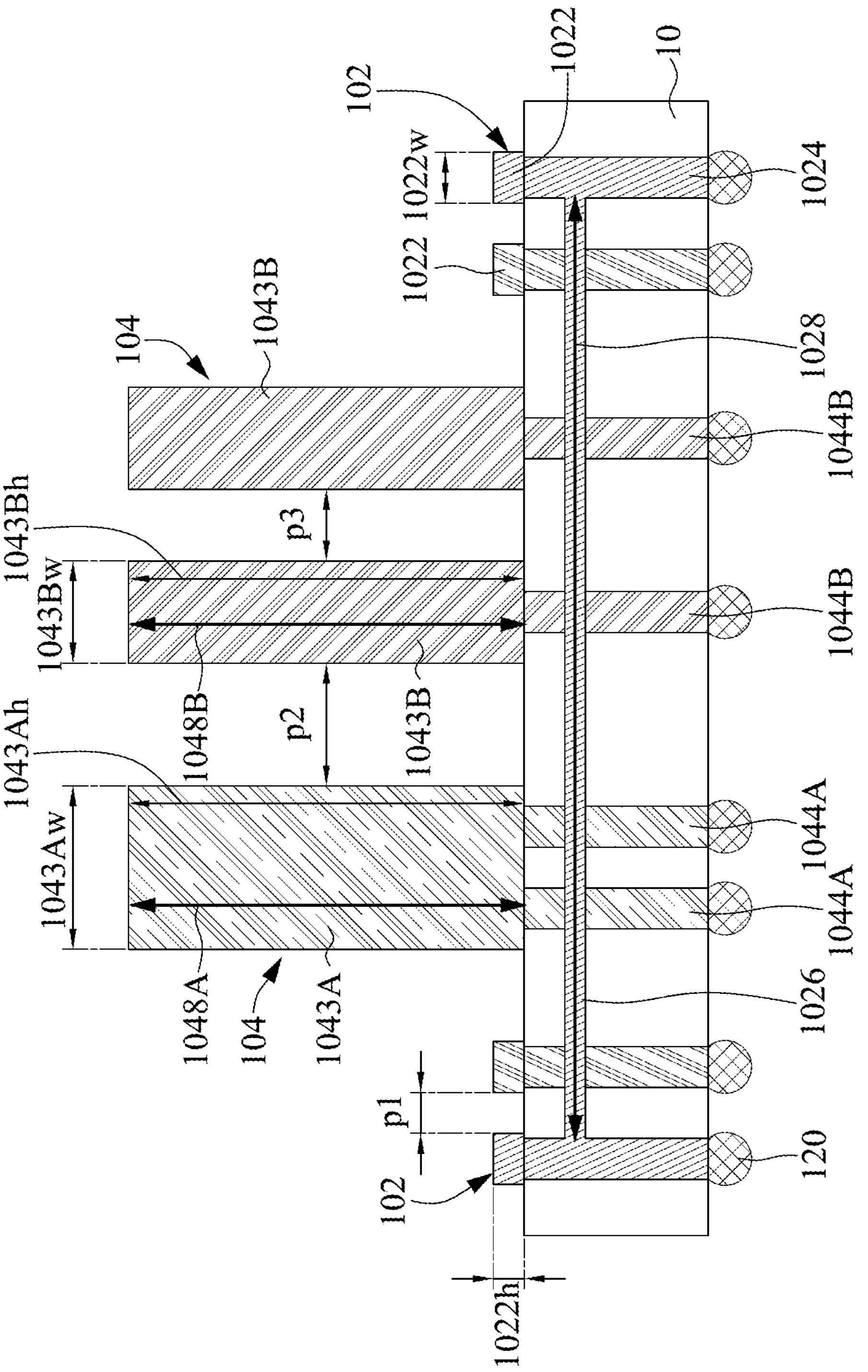
FIG. 2 illustrates a schematic cross-sectional view of a bridge component in accordance with some arrangements of the present disclosure.

As shown in FIG. 1, the interconnector 102 may be configured to electrically connect the electronic component 20A and the electronic component 20B. The interconnector 102 may include a plurality of interconnector structures (also denoted as 102 and referred to as interconnector 102), some of which are disposed under and bonded to the electronic component 20A and some of which are disposed under and bonded to the electronic component 20B. The interconnector 102 may include conductive pads 1022 and conductive trace (such as the conductive trace 1026 shown in FIG. 2). The conductive pads 1022 may be replaced with or referred to as conductive pillars. The conductive pads 1022 may be disposed adjacent to the surface 10*a* of the bridge component 10A. In some arrangements, the conductive pads 1022 are disposed on or embedded in the surface 10*a* of the bridge component 10A. The conductive pads 1022 may be electrically connected to the electronic component 20A and the electronic component 20B. The bridge component 10A may include at least one conductive through via 1024. The conductive through vias 1024 may be disposed in the bridge component 10A. The conductive through vias 1024 may be electrically connected to the conductive pads 1022. In some arrangements, the conductive through vias 1024 may be included in the interconnector 102. That is, the conductive through vias 1024 may be a part of the interconnector 102. The conductive through vias 1024 may extend from the surface 10*a* of the bridge component 10A through the bridge component 10A to the surface 10*b* of the bridge component 10A. Conductors 120, such as solder materials, may be disposed on the surface 10*b* of the bridge component 10A and configured to bond or electrically connect the conductive through via 1024 to a substrate. The conductive trace (such as the conductive trace 1026) may be disposed on or within the bridge component 10A. The conductive trace (such as the conductive trace 1026) may be a portion of a redistribution layer (RDL) of the bridge component 10A. As shown in FIG. 2, the conductive trace 1026 may be electrically connected to the conductive pads 1022. The conductive trace 1026 may be configured to form a horizontal transmission path 1028 (e.g., horizontal electrical transmission path). The conductive trace 1026 may be configured to transmit signals (e.g., electrical signals) between the electronic component 20A and the electronic component 20B. The conductive trace 1026 shown in FIG. 2 is simplified by expressing the trace(s) in the same cross section and in the same horizontal level.

As shown in FIG. 1, the interconnector 104 may be configured to be electrically connected to the electronic component 30A and/or the electronic component 30B. The interconnector 104 may include a plurality of interconnector structures (also denoted as 104 and referred to as interconnector 104), some of which are disposed under and bonded to the electronic component 30A and some of which are disposed under and bonded to the electronic component 30B. The interconnector 104 may include at least one conductive pillar 1043A. In some arrangements, the interconnector 104 may further include at least one conductive pad 1042A. The conductive pad 1042A may be bonded or electrically connected to the conductive pillar 1043A by a conductor 1045A, such as a solder material. The conductive pad 1042A may be disposed adjacent to the surface 10*a* of the bridge component 10A. In some arrangements, the conductive pad 1042A is disposed on or embedded in the surface 10*a* of the bridge component 10A. The bridge component 10A may include at least one conductive through via 1044A. The conductive through vias 1044A may be disposed in the bridge component 10A. The conductive through vias 1044A may be electrically connected to the conductive pads 1042A. In some alternative arrangements, the conductive through vias 1044A may be directly connected to the conductive pillar 1043A as shown in FIG. 2. In some arrangements, the conductive through vias 1044A may be included in the interconnector 104. That is, the conductive through vias 1044A may be a part of the interconnector 104. The conductive through vias 1044A may extend from the surface 10*a* of the bridge component 10A through the bridge component 10A to the surface 10*b* of the bridge component 10A. The conductive through vias 1044A may penetrate through the bridge component 10A. The conductive through vias 1044A may be configured to be electrically connected to a substrate or an external circuit. Conductors 120, such as solder materials, may be disposed on the surface 10*b* of the bridge component 10A and configured to bond or electrically connect the conductive through vias 1044A to a substrate. The conductive pillar 1043A may be disposed on the surface 10*a* of the bridge component 10A. The conductive pillar 1043A may be disposed between the electronic component 20A and the electronic component 20B. The conductive pillar 1043A may be disposed in the gap between the electronic component 20A and the electronic component 20B. The conductive pillar 1043A may extend into the gap. The conductive pillar 1043A may extend through the gap. The conductive pillar 1043A may be electrically connected to the electronic component 30A. In some arrangements, the conductive pillar 1043A may be electrically connected to a plurality of conductive through vias 1044A (e.g., two or more conductive through vias 1044A). In some embodiments, the conductive pillar 1043A may be electrically connected to an RDL (not shown) of the bridge component 10A which may be electrically connected to the conductive through vias 1044A or the conductive pad 1022.

Additionally or alternatively, the interconnector 104 may include at least one conductive pillar 1043B. In some arrangements, the interconnector 104 may further include at least one conductive pad 1042B. The conductive pad 1042B may be bonded or electrically connected to the conductive pillar 1043B by a conductor 1045B, such as a solder material. The conductive pad 1042B may be disposed adjacent to the surface 10*a* of the bridge component 10A. In some arrangements, the conductive pad 1042B is disposed on or embedded in the surface 10*a* of the bridge component 10A. The bridge component 10A may include at least one conductive through via 1044B. The conductive through via 1044B may be disposed in the bridge component 10A. The conductive through via 1044B may be electrically connected to the conductive pad 1042B. In some alternative arrangements, the conductive through via 1044B may be directly connected to the conductive pillar 1043B as shown in FIG. 2. In some arrangements, the conductive through via 1044B may be included in the interconnector 104. That is, the conductive through vias 1044B may be a part of the interconnector 104. The conductive through via 1044B may extend from the surface 10*a* of the bridge component 10A through the bridge component 10A to the surface 10*b* of the bridge component 10A. The conductive through vias 1044B may penetrate through the bridge component 10A. The conductive through via 1044B may be configured to be electrically connected to a substrate or an external circuit. Conductors 120, such as solder materials, may be disposed on the surface 10*b* of the bridge component 10A and configured to bond or electrically connect the conductive through via 1044B to a substrate. The conductive pillar 1043B may be disposed on the surface 10*a* of the bridge component 10A. The conductive pillar 1043B may be disposed between the electronic component 20A and the electronic component 20B. The conductive pillar 1043B may be disposed in the gap between the electronic component 20A and the electronic component 20B. The conductive pillar 1043B may extend into the gap. The conductive pillar 1043B may extend through the gap. The conductive pillar 1043B may be electrically connected to the electronic component 30B. In some arrangements, the conductive pillar 1043B may be electrically connected to a single conductive through via 1044B. In some embodiments, the conductive pillar 1043B may be electrically connected to an RDL (not shown) of the bridge component 10A which may be electrically connected to the conductive through via 1044B or the conductive pad 1022.

By means of the interconnector 102 of the bridge component 10A, the electronic components 20A and the electronic component 20B can be integrated horizontally without using an RDL as an entire layer extending from one side of the package structure to another. Therefore, the costs caused by the RDL can be reduced. By means of the interconnector 104 of the bridge component 10A, the electronic component 20A/20B and the electronic component 30A/30B can be integrated vertically. Therefore, the electronic component 30A/30B can be disposed on the electronic component 20A/20B so that the footprint (area) of the package structure can be reduced.

FIG. 2 illustrates a schematic enlarged cross-sectional view of a bridge component 10 in accordance with some arrangements of the present disclosure. The bridge components of the present disclosure (such as the bridge components 10A, 10B and 10C; see FIG. 1) may be designed and adjusted in accordance with some aspects of the bridge component 10. As shown in FIG. 2, the interconnector 102 may include a transmission path 1028. The transmission path 1028 may be substantially horizontal. The transmission path 1028 may be between the electronic component 20A and the electronic component 20B. The transmission path 1028 may be used to transmit signals (e.g., electrical signals) between the electronic component 20A and the electronic component 20B. The transmission path 1028 may be formed by the conductive trace 1026. The conductive trace 1026 may be a part of an RDL of the bridge component 10. A projection of the conductive trace 1026 in a horizontal direction may overlap the conductive through vias 1044A, 1044B. The interconnector 104 may include a transmission path 1048A. The transmission path 1048A may be a power transmission path or a ground (GND) path. The transmission path 1048A may not be parallel to the transmission path 1028. In some arrangements, the transmission path 1048A may be substantially perpendicular to the transmission path 1028. The transmission path 1048A may be formed by the conductive pillar 1048A. Additionally or alternatively, the interconnector 104 may include a transmission path 1048B. The transmission path 1048B may be a signal transmission path or a ground (GND) path. The transmission path 1048B may not be parallel to the transmission path 1028. In some arrangements, the transmission path 1048B may be substantially perpendicular to the transmission path 1028. The transmission path 1048B may be formed by the conductive pillar 1048B. The transmission path 1048B may be substantially parallel to the transmission path 1048A. The signal transmission path 1048B may be located closer to an electronic component (e.g., the electronic component 20B shown in FIG. 1) than the power transmission path 1048A is.

Still referring to FIG. 2, the bridge component 10 may be provided with conductive pads and conductive pillars having various heights, widths or pitches for different purposes. The conductive pad (or conductive pillar) 1022 has a width 1022*w* and a height 1022*h*. The conductive pillar 1043A has a width 1043Aw and a height 1043Ah. The conductive pillar 1043B has a width 1043Bw and a height 1043Bh. A line width of the conductive trace 1026, the width 1043Aw of the conductive pillar 1043A, the width 1043Bw of the conductive pillar 1043B, and/or the width 1022*w* of the conductive pad 1022 may be different from each other. For example, a line width of the conductive trace 1026 may be smaller than the width 1043Aw of the conductive pillar 1043A and/or the width 1043Bw of the conductive pillar 1043B. The width 1043Aw of the conductive pillar 1043A may be greater than the width 1022*w* of the conductive pad 1022. The width 1043Bw of the conductive pillar 1043B may be greater than the width 1022*w* of the conductive pad 1022. The width 1043Aw of the conductive pillar 1043A may be greater than the width 1043Bw of the conductive pillar 1043B. The height 1043Ah of the conductive pillar 1043A and the height 1043Bh of the conductive pillar 1043B may be different from the height 1022*h* of the conductive pad 1022. For example, the height 1043Ah of the conductive pillar 1043A may be greater than the height 1022*h* of the conductive pad 1022. The height 1043Bh of the conductive pillar 1043B may be greater than the height 1022*h* of the conductive pad 1022. The height 1043Ah of the conductive pillar 1043A may be substantially the same as the height 1043Bh of the conductive pillar 1043B. In other words, the conductive pad 1022 may have a relatively small width and a relatively small height for connection with electronic components, such as the electronic components 20A and 20B, disposed side by side at a first horizontal level. The conductive pillar 1043A may have a relatively large width (connected to a plurality of conductive through vias 1044A) and a relatively large height and may reduce resistance of power/GND transmission for an electronic component, such as the electronic component 30A, disposed at a second horizontal level higher than the first horizontal level. The conductive pillar 1043B may have a relatively small width (as compared to the conductive pillar 1043A) (connected to a single conductive through via 1044B) and a relatively large height to increase its number and thus increase bandwidth of signal/GND transmission for an electronic component, such as the electronic component 30B, disposed on the second horizontal level higher than the first horizontal level.

A pitch (or spacing) of the conductive trace 1026 may be smaller than a pitch (or spacing) of the interconnector 104. For example, a pitch (or spacing) between the lines of the conductive trace 1026 may be smaller than a pitch (or spacing) p2 between the conductive pillar 1043A and the conductive pillar 1043B, and/or a pitch (or spacing) p3 between the conductive pillars 1043B, and/or a pitch (or spacing) between the conductive pillars 1043A. The pitch p2 between the conductive pillar 1043A and the conductive pillar 1043B may be greater than a pitch (or spacing) p1 between the conductive pads 1022. The pitch p3 between the conductive pillars 1043B may be greater than the pitch (or spacing) p1 between the conductive pads 1022. The pitch between the conductive pillars 1043A may be greater than the pitch (or spacing) p1 between the conductive pads 1022. The pitch p2 between the conductive pillar 1043A and the conductive pillar 1043B may be greater than the pitch p3 between the conductive pillars 1043B.

The electronic component 20A and the electronic component 20B each may be or include a semiconductor die. The electronic component 20A and the electronic component 20B each may be or include a logic die. The electronic component 20A and the electronic component 20B each may be or include an application-specific integrated circuit (ASIC) die.

As shown in FIG. 1, the electronic component 20A and the electronic component 20B may be disposed side by side on the bridge component 10A. The electronic component 20A and the electronic component 20B may be disposed at substantially the same horizontal level (height). A projection of the electronic component 20A in a vertical direction may partially overlap the bridge component 10A. A portion of the projection of the electronic component 20A in a vertical direction may not overlap the bridge component 10A. A projection of the electronic component 20B in a vertical direction may partially overlap the bridge component 10A. A portion of the projection of the electronic component 20B in a vertical direction may not overlap the bridge component 10A. The electronic component 20A and the electronic component 20B may be bonded to the bridge component 10A. The electronic component 20A and/or the electronic component 20B may be directly bonded to the bridge component 10A without using an entire RDL extending from one side of the package structure to another. The electronic component 20A and the electronic component 20B may be bonded to the conductive pads 1022 of the bridge component 10A. The electronic component 20A may be electrically connected to the electronic component 20B through the bridge component 10A. The electronic component 20A may be electrically connected to the electronic component 20B through the interconnector 102. The electronic component 20A may be electrically connected to the electronic component 20B through the conductive pads 1022 and the conductive trace 1026. The electronic component 20A and/or the electronic component 20B may be electrically connected to a substrate or an external circuit through the conductive pads 1022 and the conductive through vias 1024.

The electronic component 20A may have a surface 20A1, a surface 20A2 opposite to the surface 20A1, and a surface 20A3 and a surface 20A4 connecting the surface 20A1 and the surface 20A2. The surface 20A1 may be referred to as an upper surface or a backside surface of the electronic component 20A. The surface 20A2 may be referred to as a lower surface of the electronic component 20A and may be an active surface. The surface 20A3 may be referred to as an inner lateral surface of the electronic component 20A. The surface 20A4 may be referred to as an outer lateral surface of the electronic component 20A. The electronic component 20B may have a surface 20B1, a surface 20B2 opposite to the surface 20B1, and a surface 20B3 and a surface 20B4 connecting the surface 20B1 and the surface 20B2. The surface 20B1 may be referred to as an upper surface or a backside surface of the electronic component 20B. The surface 20B2 may be referred to as a lower surface of the electronic component 20B and may be an active surface. The surface 20B3 may be referred to as an inner lateral surface of the electronic component 20B. The surface 20B4 may be referred to as an outer lateral surface of the electronic component 20B.

The surface 20A2 of the electronic component 20A and the surface 20B2 of the electronic component 20B may face the surface 10*a* of the bridge component 10A. A portion of the surface 20A2 of the electronic component 20A may not be covered by the bridge component 10A. A portion of the surface 20B2 of the electronic component 20B may not be covered by the bridge component 10A. The conductive pillar 1043A of the interconnector 104 may extend along the surface 20A3 of the electronic component 20A. The conductive pillar 1043B of the interconnector 104 may extend along the surface 20B3 of the electronic component 20B. An upper surface 1043A1 of the conductive pillar 1043A is not lower than the surface 20A1 of the electronic component 20A and/or the surface 20B1 of the electronic component 20B. The upper surface 1043A1 of the conductive pillar 1043A may be substantially coplanar with the surface 20A1 of the electronic component 20A and/or the surface 20B1 of the electronic component 20B. In some alternative arrangements, the upper surface 1043A1 of the conductive pillar 1043A may be higher than the surface 20A1 of the electronic component 20A and/or the surface 20B1 of the electronic component 20B. An upper surface 1043B1 of the conductive pillar 1043B is not lower than the surface 20A1 of the electronic component 20A and/or the surface 20B1 of the electronic component 20B. The upper surface 1043B1 of the conductive pillar 1043B may be substantially coplanar with the surface 20A1 of the electronic component 20A and/or the surface 20B1 of the electronic component 20B. In some alternative arrangements, the upper surface 1043B1 of the conductive pillar 1043B may be higher than the surface 20A1 of the electronic component 20A and/or the surface 20B1 of the electronic component 20B.

The electronic component 20A may include at least one conductive pad 202A and/or at least one conductive pillar 203A. The conductive pad 202A may be disposed adjacent to the surface 20A2 of the electronic component 20A. The conductive pad 202A and/or the conductive pillar 203A may be disposed on the surface 20A2 of the electronic component 20A. The conductive pad 202A may be bonded to the conductive pad 1022 by a conductor 220 such as a solder material. The conductive pillar 203A may be configured to electrically connect the electronic component 20A to a substrate or an external circuit.

The electronic component 20B may include at least one conductive pad 202B and/or at least one conductive pillar 203B. The conductive pad 202B may be disposed adjacent to the surface 20B2 of the electronic component 20B. The conductive pad 202B and/or the conductive pillar 203B may be disposed on the surface 20B2 of the electronic component 20B. The conductive pad 202B may be bonded to the conductive pad 1022 by a conductor 220 such as a solder material. The conductive pillar 203B may be configured to electrically connect the electronic component 20B to a substrate or an external circuit.

The electronic component 30A and the electronic component 30B each may be or include a semiconductor die. The electronic component 30A and the electronic component 30B each may be or include a memory die. The electronic component 30A and the electronic component 30B each may be or include a dynamic random access memory (DRAM) die.

As shown in FIG. 1, the electronic component 30A and the electronic component 30B may be disposed at a horizontal level (height) different from the electronic component 20A and the electronic component 20B. The electronic component 30A and the electronic component 30B may be disposed at a horizontal level (height) higher than the electronic component 20A and the electronic component 20B. The electronic component 30A may be disposed on the electronic component 20A. The electronic component 30B may be disposed on the electronic component 20B. A projection of the electronic component 30A in a vertical direction may overlap at least a part of the electronic component 20A. A projection of the electronic component 30B in a vertical direction may overlap at least a part of the electronic component 20B. The electronic component 30A and the electronic component 30B may be disposed side by side. The electronic component 30A and the electronic component 30B may be disposed at substantially the same horizontal level (height). The electronic component 30A may be bonded to the interconnector 104, for example, by a conductor 320 such as a solder material. The electronic component 30A may be directly bonded to the interconnector 104. The electronic component 30A may be bonded to the conductive pillar 1043A by the conductor 320. The electronic component 30A may be electrically connected to the interconnector 104. The electronic component 30A may be electrically connected to the conductive pillar 1043A. The electronic component 30B may be bonded to the interconnector 104, for example, by a conductor 320 such as a solder material. The electronic component 30B may be directly bonded to the interconnector 104. The electronic component 30B may be bonded to the conductive pillar 1043B by the conductor 320. The electronic component 30B may be electrically connected to the interconnector 104. The electronic component 30B may be electrically connected to the conductive pillar 1043B. The electronic component 30A may be electrically connected to the electronic component 20A and/or the electronic component 20B through the bridge component 10A. The electronic component 30B may be electrically connected to the electronic component 20A and/or the electronic component 20B through the bridge component 10A. The electronic component 30A and/or the electronic component 30B may be electrically connected to the electronic component 20A and/or the electronic component 20B through an interconnector(s) of the bridge component 10A, such as the interconnector 102 and the interconnector 104. The electronic component 30A and/or the electronic component 30B may be electrically connected to the electronic component 20A and/or the electronic component 20B through the conductive pillars 1043A and/or 1043B, the conductive pads 1022, and a conductive trace(s) electrically connecting the conductive pillars and the conductive pads. The electronic component 30A and/or the electronic component 30B may be electrically connected to a substrate or an external circuit through the bridge component 10A. The electronic component 30A and/or the electronic component 30B may be electrically connected to a substrate or an external circuit through an interconnector(s) of the bridge component 10A, such as the interconnector 104. The electronic component 30A and/or the electronic component 30B may be electrically connected to a substrate or an external circuit through the conductive pillars 1043A and/or 1043B and the conductive through vias 1044A and/or 1044B.

The package structure 1 may further include a bridge component 10B. The bridge component 10B may be similar to the bridge component 10A or the bridge component 10 described above. The bridge component 10B may be disposed at substantially the same horizontal level (height) as the bridge component 10A. A portion of the bridge component 10B may be disposed under the electronic component 20A. In other words, the bridge component 10B may extend beyond the surface 20A4 of the electronic component 20A so that a portion of the bridge component 10B is disposed under the electronic component 20A. The bridge component 10B may stick out with respect to the electronic component 20A. A projection of the bridge component 10B in a vertical direction may partially overlap the electronic component 20A. A portion of the projection of the bridge component 10B in a vertical direction may not overlap the electronic component 20A. A projection of the electronic component 20A in a vertical direction may partially overlap the bridge component 10B. A portion of the projection of the electronic component 20A in a vertical direction may not overlap the bridge component 10B. The electronic component 20A may be bonded to the bridge component 10B. The electronic component 20A may be directly bonded to the bridge component 10B without using an entire RDL extending from one side of the package structure to another.

The bridge component 10B may include at least one interconnector 122 and at least one interconnector 124. The interconnector 122 may include a conductive pad which may be similar to the conductive pad 1022 and a conductive trace which may be similar to the conductive trace 1026. The interconnector 124 may be similar to the interconnector 104 described above. The interconnector 124 may include at least one conductive pillar which may be similar to the conductive pillar 1043A or 1043B. The electronic component 20A may be bonded to the interconnector 122. The conductive pad 202A may be bonded to the interconnector 122 by a conductor 220 such as a solder material. The electronic component 30A may be bonded to the interconnector 124 by a conductor 320 such as a solder material. The electronic component 30A may be electrically connected to the interconnector 124. The electronic component 30A may be electrically connected to the electronic component 20A through the bridge component 10B. The electronic component 30A may be electrically connected to the electronic component 20A through an interconnector(s) of the bridge component 10B, such as the interconnector 122 and the interconnector 124. The electronic component 30A may be electrically connected to a substrate or an external circuit through the bridge component 10B. The electronic component 30A may be electrically connected to a substrate or an external circuit through an interconnector(s) of the bridge component 10B, such as the interconnector 124.

The package structure 1 may further include an electronic component 40A and/or an electronic component 40B. The electronic component 40A and the electronic component 40B each may be or include a passive component. The electronic component 40A and the electronic component 40B each may be or include a capacitor (e.g., decoupling capacitor), such as a silicon capacitor. The electronic component 40A and the electronic component 40B may be disposed at substantially the same horizontal level (height) as the bridge component 10A and/or the bridge component 10B. The electronic component 40A may be disposed under the electronic component 20A. The electronic component 40A may be located closer to the surface 20A4 of the electronic component 20A than the bridge component 10A is. The electronic component 40A may be bonded to the electronic component 20A. The electronic component 40A may be electrically connected to the electronic component 20A through, for example, conductive pads and a conductor such as a solder material. The electronic component 40A may include at least one conductive through via which may be electrically connected to a substrate or an external circuit. The electronic component 40B may be disposed under the electronic component 20B. The electronic component 40B may be located closer to the surface 20B4 of the electronic component 20B than the bridge component 10A is. The electronic component 40B may be bonded to the electronic component 20B. The electronic component 40B may be electrically connected to the electronic component 20B through, for example, conductive pads and a conductor such as a solder material. The electronic component 40B may include at least one conductive through via which may be electrically connected to a substrate or an external circuit. In some embodiments, the electronic component 40A (or the electronic component 40B) may be disposed under the electronic component 20A (or the electronic component 20B) and adjacent to the power pads of the electronic component 20A (or the electronic component 20B). In some embodiments, the electronic component 40A (or the electronic component 40B) may be disposed under the electronic component 20A (or the electronic component 20B) at a position near the center of the electronic component 20A (or the electronic component 20B).

The package structure 1 may further include an electronic component 22. The electronic component 22 may be or include a semiconductor die. The electronic component 22 may be or include a memory die, such as a high bandwidth memory (HBM) die. The electronic component 22 may be disposed adjacent to the electronic component 20B. The electronic component 22 may be disposed at substantially the same horizontal level (height) as the electronic component 20A and/or the electronic component 20B.

The electronic component 22 may be bonded to a bridge component 10C through, for example, conductive pads and a conductor such as a solder material. The bridge component 10C may be similar to the bridge component 10A and/or the bridge component 10 described above. The bridge component 10C may include at least one interconnector 142. The interconnector 142 may be similar to the interconnector 102 described above. The interconnector 142 may include at least one conductive pad which may be similar to the conductive pad 1022 and at least one conductive trace which may be similar to the conductive trace 1026. The bridge component 10C may be disposed at substantially the same horizontal level (height) as the bridge component 10A. The electronic component 22 may be electrically connected to the electronic component 20B through the bridge component 10C. The electronic component 22 may be electrically connected to the electronic component 20B through the interconnector 142. The electronic component 20B may be bonded to the bridge component 10C through, for example, conductive pads and a conductor such as a solder material (the conductive pad 202B, the conductive pad of the interconnector 142 and the conductor 220).

The electronic component 22 may be bonded to an electronic component 40C through, for example, conductive pads and a conductor such as a solder material. The electronic component 40C may be or include a passive component. The electronic component 40C may be or include a capacitor, such as a silicon capacitor. The electronic component 40C may be disposed at substantially the same horizontal level (height) as the bridge component 10A. The electronic component 40C may be disposed adjacent to the bridge component 10C. The electronic component 40C may be electrically connected to the electronic component 22. The electronic component 40C may include at least one conductive through via which may be electrically connected to a substrate or an external circuit. The electronic component 40C may include an interconnector 404 which may be similar to the interconnector 104. The interconnector 404 may include a conductive pillar which may be similar to the conductive pillar 1043A, a conductor which may be similar to the conductor 1045A, a conductive pad which may be similar to the conductive pad 1042A, and/or at least one conductive through via which may be similar to the conductive through via 1044A. The electronic component 30B may be bonded to the interconnector 404 by a conductor 320, such as a solder material. The electronic component 30B may be electrically connected to the interconnector 404.

The package structure 1 may further include an encapsulant 50. The encapsulant 50 may be or include a molding compound. The encapsulant 50 may cover the bridge component 10A, the bridge component 10B, the bridge component 10C, the electronic component 20A, the electronic component 20B, the electronic component 22, the electronic component 40A, the electronic component 40B, and/or the electronic component 40C. The encapsulant 50 may cover the interconnector 102, the interconnector 104, the interconnector 122, the interconnector 124, the interconnector 142, and/or the interconnector 404. The encapsulant 50 may cover the conductive pillar 1043A, the conductive pillar 1043B, and/or the conductive pad 1022.

The package structure 1 may further include an encapsulant 60. The encapsulant 60 may be or include a molding compound. The encapsulant 60 may cover the electronic component 30A and/or the electronic component 30B.

Figure 3:
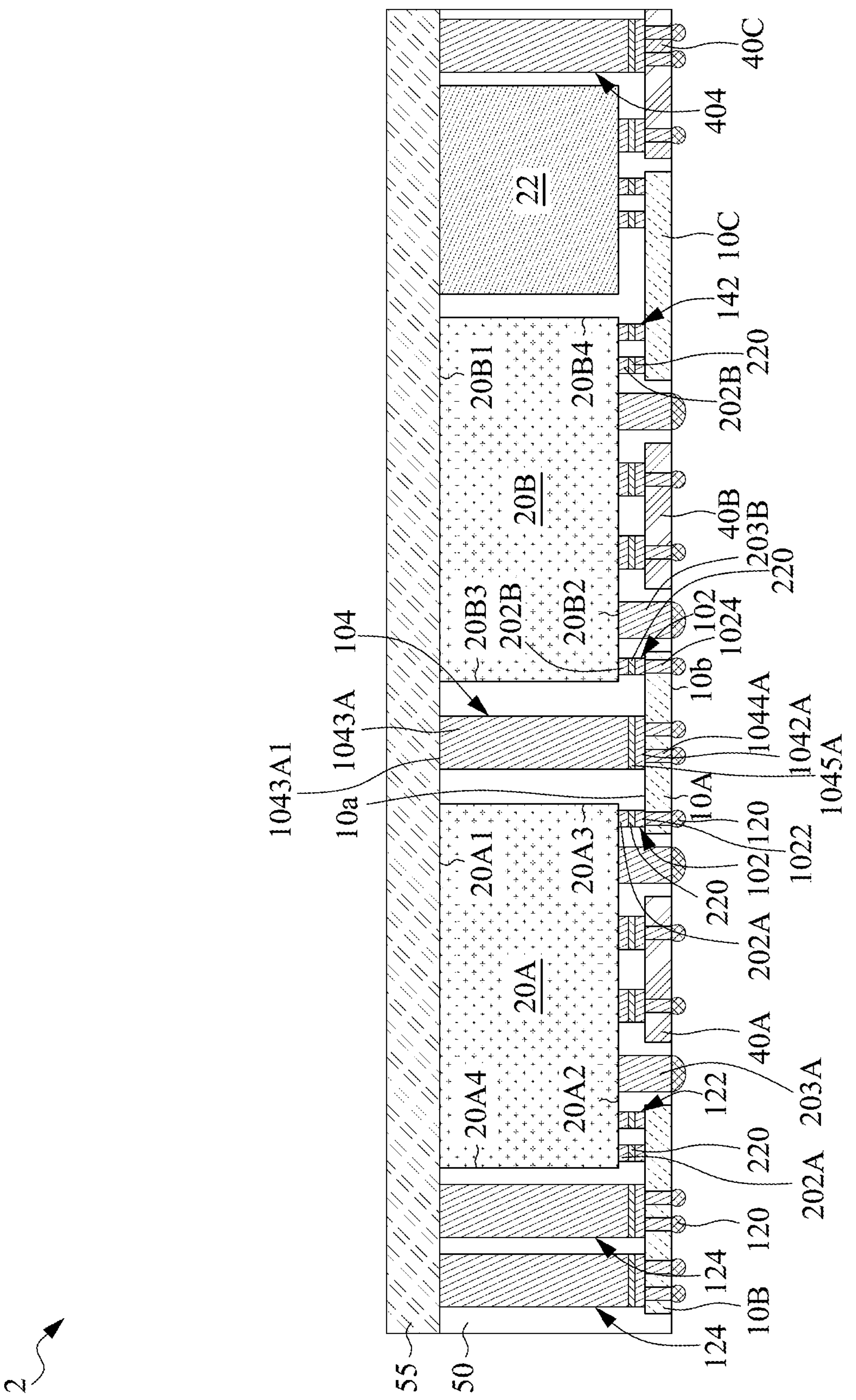
FIG. 3 illustrates a schematic cross-sectional view of a package structure in accordance with some arrangements of the present disclosure.

FIG. 3 illustrates a schematic cross-sectional view of a package structure 2 in accordance with some arrangements of the present disclosure. The package structure 2 is similar to the package structure 1 as described and illustrated with reference to FIG. 1, except for the following differences. The interconnector 104, the interconnector 124, and/or the interconnector 404 may be bonded or connected to a shielding component 55. The shielding component 55 may be or include a shielding metal sheet. The shielding component 55 may be configured to shield the electronic component 20A, the electronic component 20B and/or the electronic component 22 from electromagnetic interference. The shielding component 55 may be disposed at a horizontal level (height) higher than the electronic component 20A, the electronic component 20B and/or the electronic component 22. The shielding component 55 may be disposed on an upper surface of package structure 2. The shielding component 55 may cover the electronic component 20A, the electronic component 20B and/or the electronic component 22. The interconnector 104, the interconnector 124, and/or the interconnector 404 may be in the form of conductive pillars or in the form of a conductive plate. The interconnector 104, the interconnector 124, and/or the interconnector 404 may be configured to provide full shielding or partition shielding for the electronic component 20A, the electronic component 20B and/or the electronic component 22. In some embodiments, the interconnector 104, the interconnector 124, and/or the interconnector 404 may be configured to provide thermal releasing for the electronic component 20A, the electronic component 20B and/or the electronic component 22. In some embodiments, the shielding component 55 may be replaced by a heat sink, and the interconnector 104, the interconnector 124, and/or the interconnector 404 is connected to the heat sink for release heat.

Figure 4:
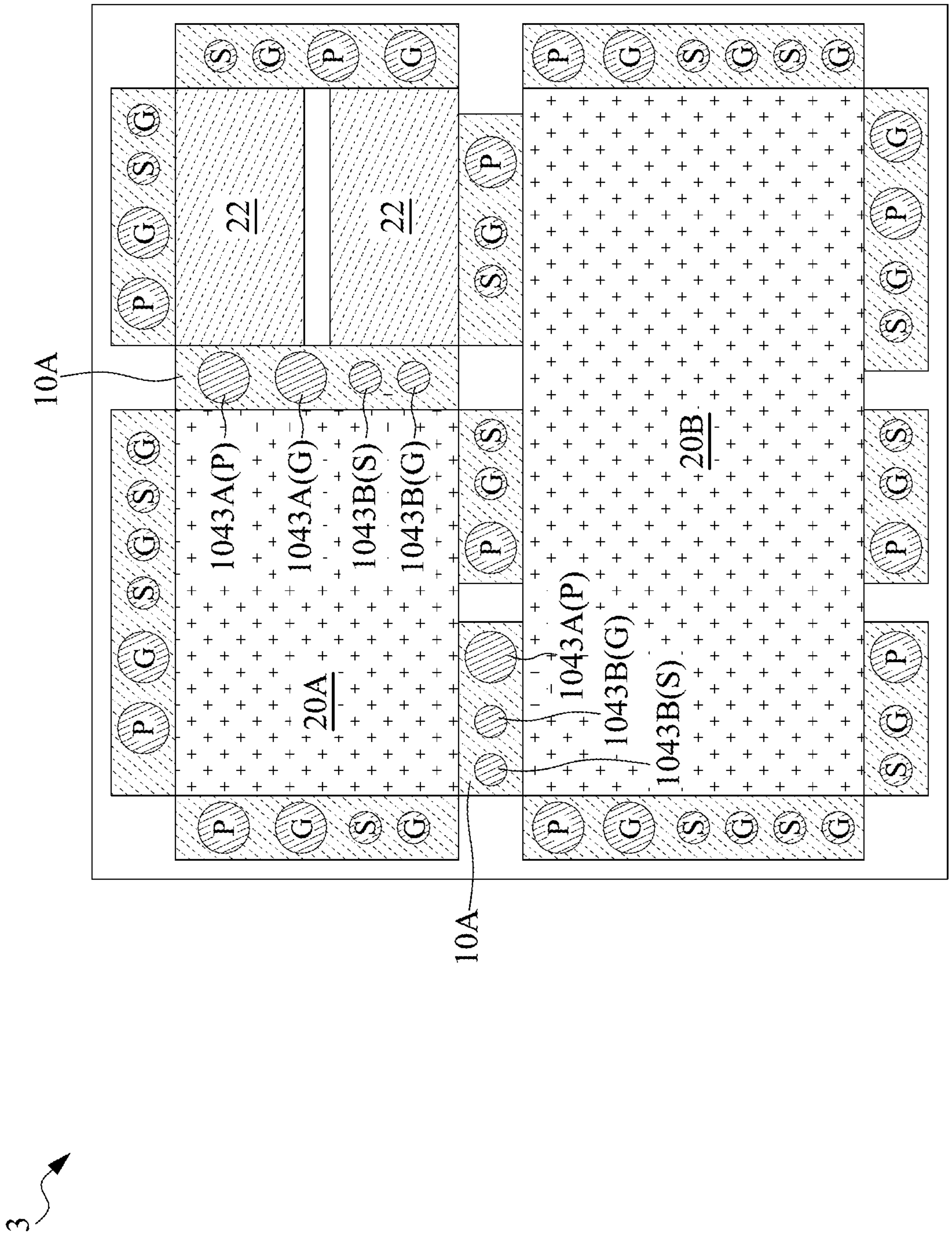
FIG. 4 illustrates a schematic top view of a package structure in accordance with some arrangements of the present disclosure.

FIG. 4 illustrates a schematic top view of a package structure 3 in accordance with some arrangements of the present disclosure. The package structure 3 may be similar to the package structure 1 described and illustrated with reference to FIG. 1 while the electronic component 30A, the electronic component 30B, the conductor 320 and the encapsulant 60 are omitted in FIG. 4 for clarity. The electronic component 20A and the electronic component 20B are disposed side by side and electrically connected to each other through one or more bridge components 10A (also see FIG. 1). The electronic component 20A (or the electronic component 20B) may be disposed side by side with the electronic component 22 and electrically connected to the electronic components 22 through the bridge component 10A. The conductive pillars 1043A and the conductive pillars 1043B of the bridge component 10A may extend upwardly from a gap between the electronic component 20A and the electronic component 20B, a gap between the electronic component 20A and the electronic component 22, or a gap between the electronic component 20B and the electronic component 22. The conductive pillars 1043A may be a power transmission path (marked as 1043A (P)) or a ground (GND) path (marked as 1043A (G)). The conductive pillars 1043B may be a signal transmission path (marked as 1043B (S)) or a ground (GND) path (marked as 1043B (G)). The package structure 3 may include additional power/GND transmission path(s) and/or signal/GND transmission path (s) disposed around the electronic component 20A, the electronic component 20B and/or the electronic component 22. The power transmission path(s), the GND transmission path(s) and the signal transmission path are marked as P, G and S, respectively. The additional power/GND transmission path(s) and/or signal/GND transmission path(s) may be provided by additional bridge component(s) 10A, bridge component(s) 10B and/or electronic component(s) 40C.

Figure 8A:
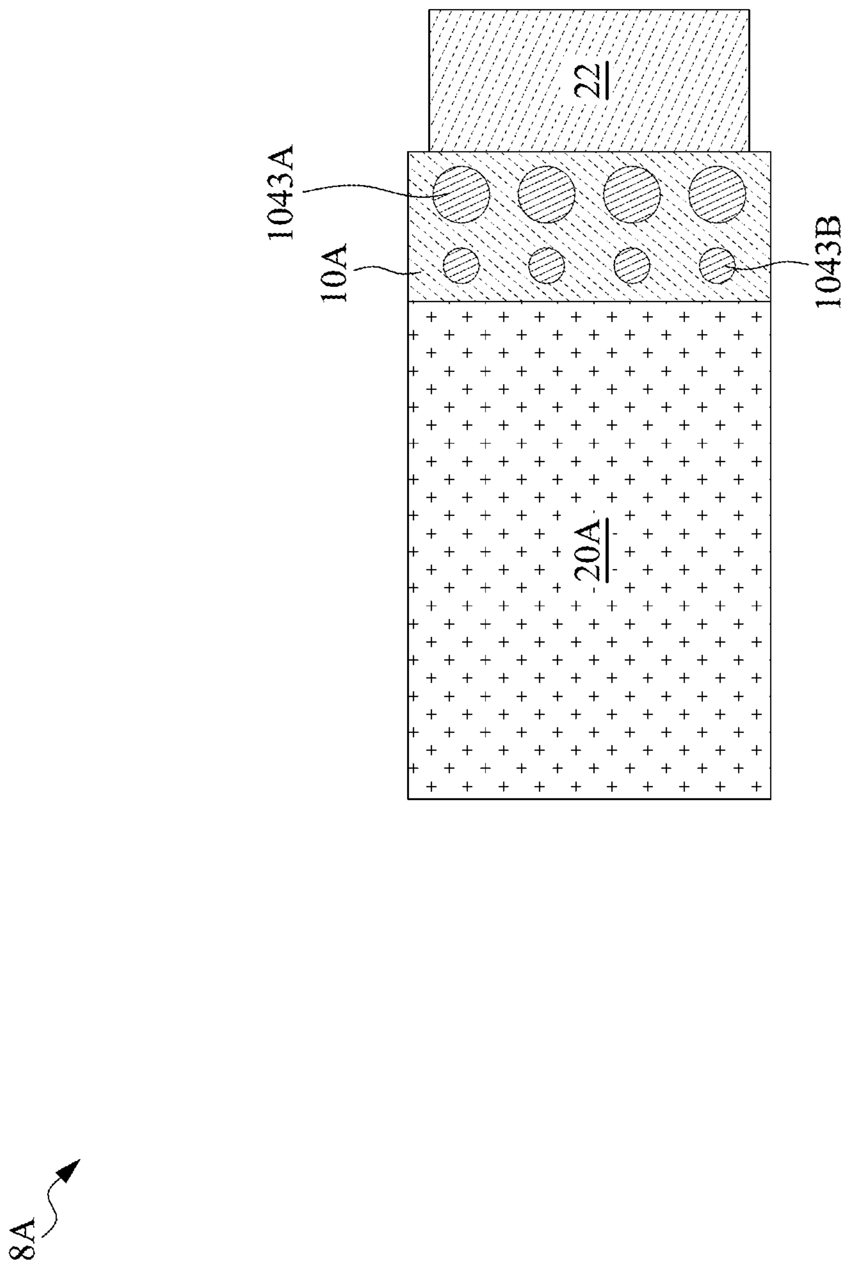
FIG. 8A, FIG. 8B and FIG. 8C illustrate schematic top views of package structures in accordance with some arrangements of the present disclosure.
Figure 8B:
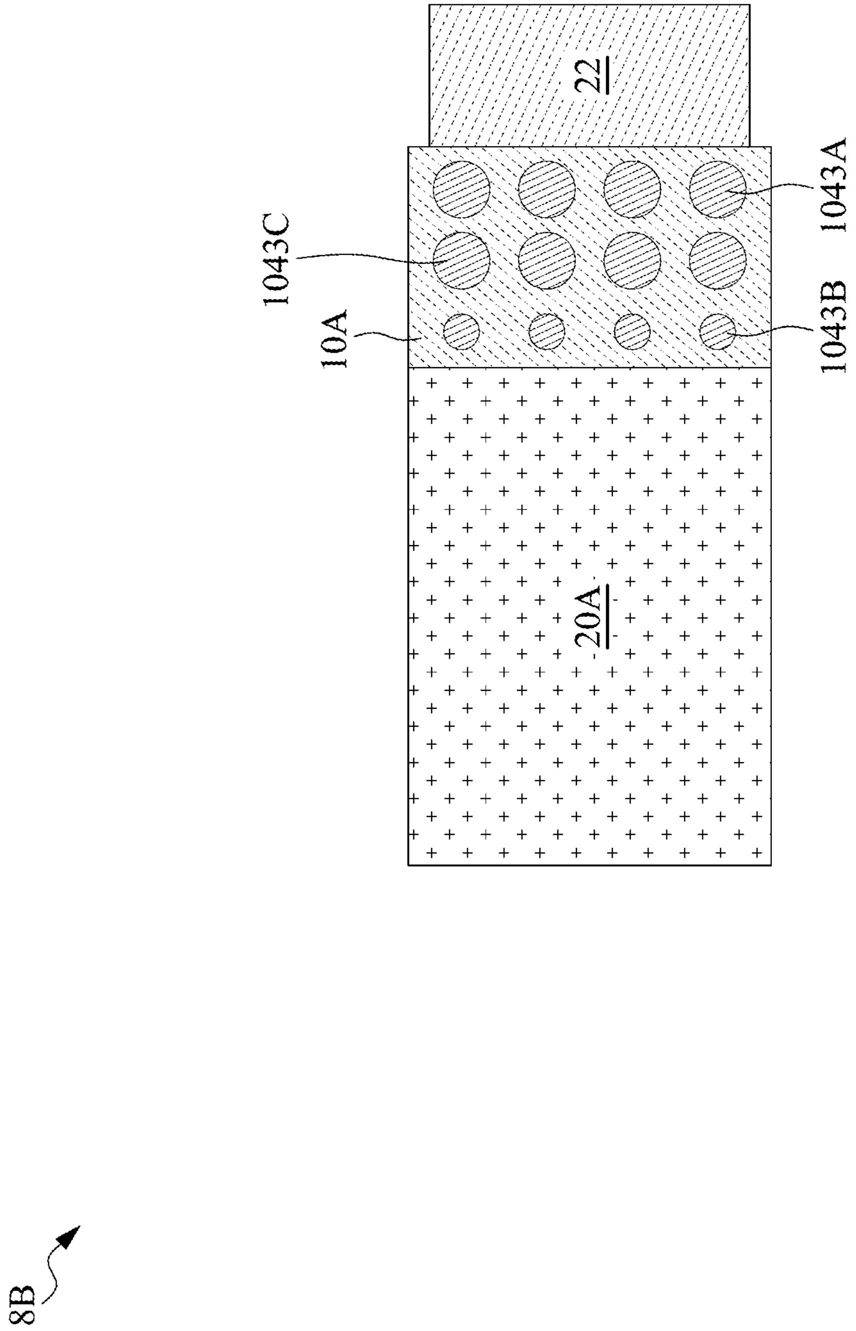
Figure 8C:
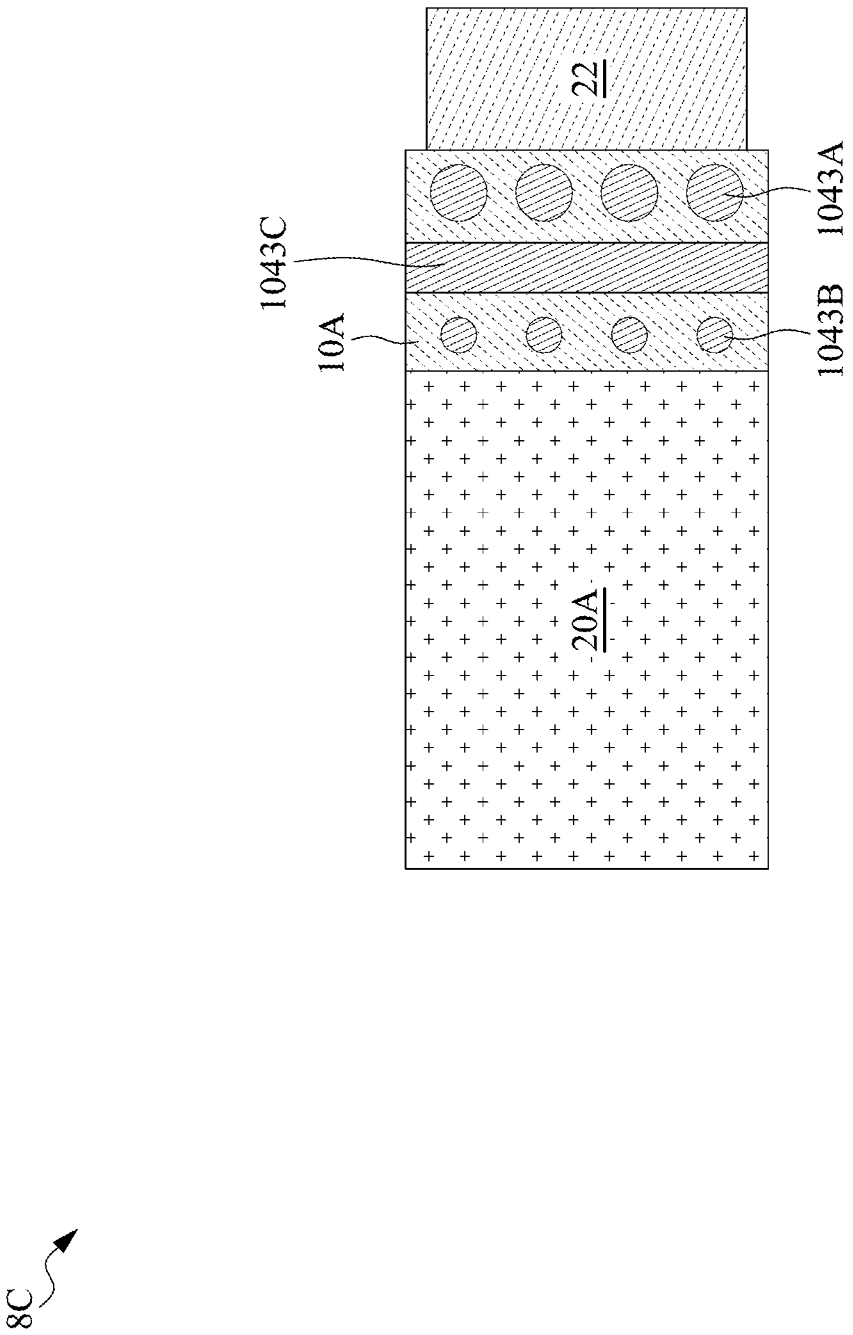

FIG. 8A, FIG. 8B and FIG. 8C illustrate schematic top views of package structures 8A, 8B and 8C in accordance with some arrangements of the present disclosure. The package structures 8A, 8B and 8C may be similar to the package structure 1 described and illustrated with reference to FIG. 1 while the electronic component 30A, the electronic component 30B, the conductor 320 and the encapsulant 60 are omitted in FIG. 8A, FIG. 8B and FIG. 8C for clarity.

In the package structure 8A illustrated in FIG. 8A, the electronic component 20A is disposed side by side with the electronic component 22 (or the electronic component 20B) and electrically connected to the electronic component 22 through the bridge component 10A. The bridge component 10A includes conductive structures, i.e., conductive pillars 1043A and conductive pillars 1043B, extend upwardly from a gap between the electronic component 20A and the electronic component 22 (or the electronic component 20B). The conductive pillars 1043A may be power transmission paths. The conductive pillars 1043B may be signal transmission paths. The conductive pillars 1043B may be disposed adjacent to the electronic component 20A. A distance of the conductive pillars 1043A to the lateral surface of the electronic component 20A is greater than the distance of the conductive pillars 1043 B to the lateral surface of the electronic component 20A. In some embodiments, the electronic component 20A may be surrounded by a plurality of signal transmission paths and then surrounded by a plurality of power transmission paths though not illustrated in FIG. 8A. In some embodiments, the electronic component 20A together with the electronic component 22 (or the electronic component 20B) may be surrounded by a plurality of signal transmission paths and then surrounded by a plurality of power transmission paths though not illustrated in FIG. 8A.

The package structure 8B illustrated in FIG. 8B is similar to the package structure 8A illustrated in FIG. 8A, and further includes an interconnector including a shielding structure 1043C (which may be also referred to as an interconnector 1043C). The shielding structure 1043C may be configured to function as a shield between the power transmission path 1048A and the signal transmission path 1048B shown in FIG. 2. The shielding structure 1043C may be or include a plurality of conductive pillars. A distance of the shielding structure 1043C to the lateral surface of the first electronic component 20A is greater than a distance of the conductive pillars 1043B to the lateral surface of the electronic component 20A. In some embodiments, though not illustrated in FIG. 8B, the electronic component 20A may be surrounded by a plurality of signal transmission paths and then surrounded by a plurality of power transmission paths and the shielding structure 1043C is disposed between the signal transmission paths and the power transmission paths. In some embodiments, though not illustrated in FIG. 8B, the electronic component 20A together with the electronic component 22 (or the electronic component 20B) may be surrounded by a plurality of signal transmission paths and then surrounded by a plurality of power transmission paths and the shielding structure 1043C is disposed between the signal transmission paths and the power transmission paths.

The package structure 8C illustrated in FIG. 8C is similar to the package structure 8B illustrated in FIG. 8B, except that the shielding structure 1043C is in a form of a conductive plate.

FIG. 5A, FIG. 5B, FIG. 5C, FIG. 5D, FIG. 5E and FIG. 5F illustrate various stages of a method for manufacturing a package structure in accordance with some arrangements of the present disclosure.

Figure 5A:
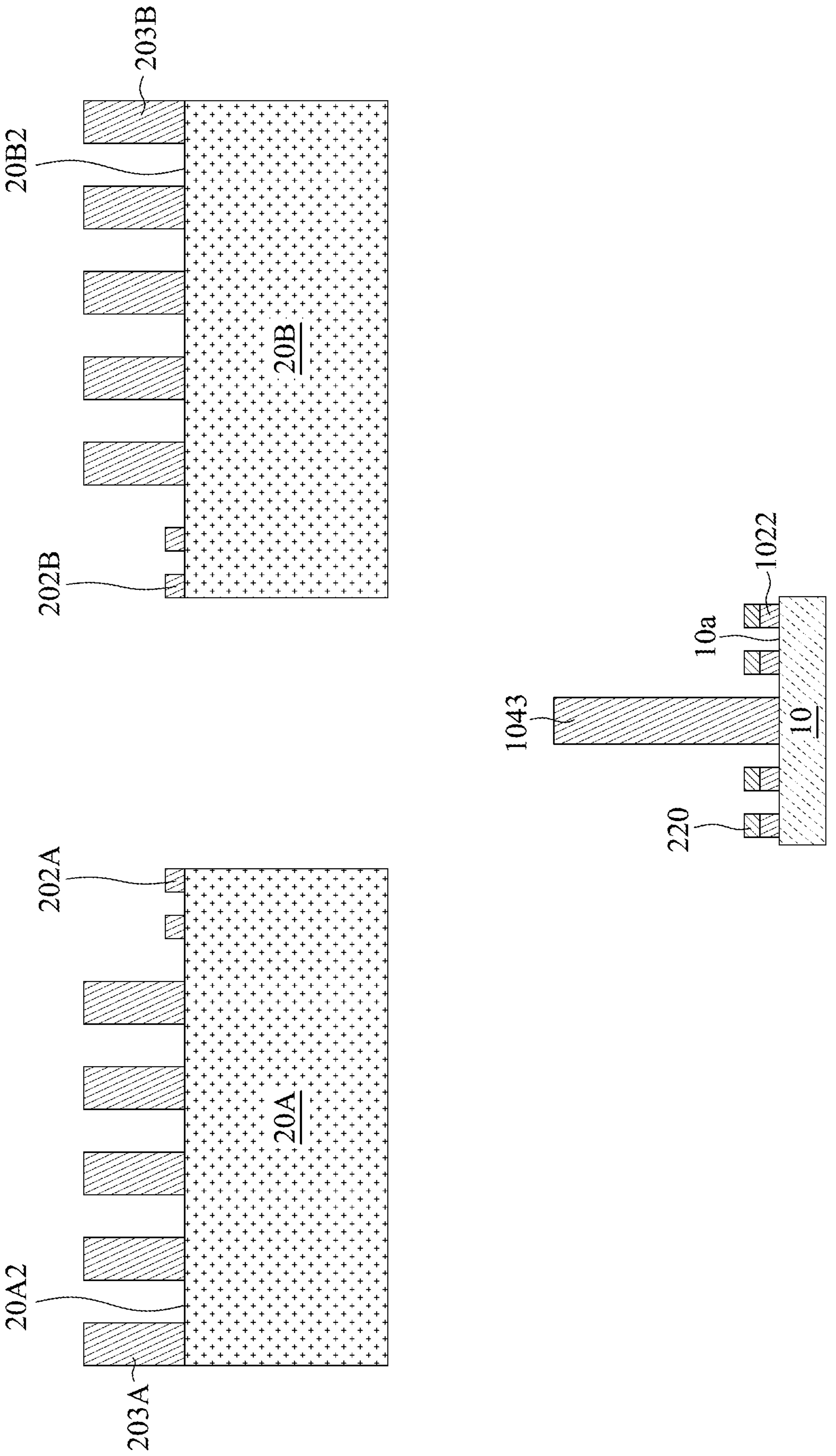
FIG. 5A, FIG. 5B, FIG. 5C, FIG. 5D, FIG. 5E and FIG. 5F illustrate various stages of a method for manufacturing a package structure in accordance with some arrangements of the present disclosure.

As shown in FIG. 5A, electronic components, including an electronic component 20A and an electronic component 20B, are provided. Bridge components, including a bridge component 10, are also provided. The electronic component 20A includes at least one conductive pad 202A and at least one conductive pillar 203A on a surface 20A2 (e.g., an active surface). The electronic component 20B includes at least one conductive pad 202B and at least one conductive pillar 203B on a surface 20B2 (e.g., an active surface). The bridge component 10 includes at least one conductive pad 1022 and at least one conductive pillar 1043 on a surface 10*a* (e.g., an active surface). In some embodiments, conductors 220 may be disposed on the conductive pads 1022. The conductors 220 may be or include a solder material. The conductors 220 may be or include solder bumps.

Figure 5B:
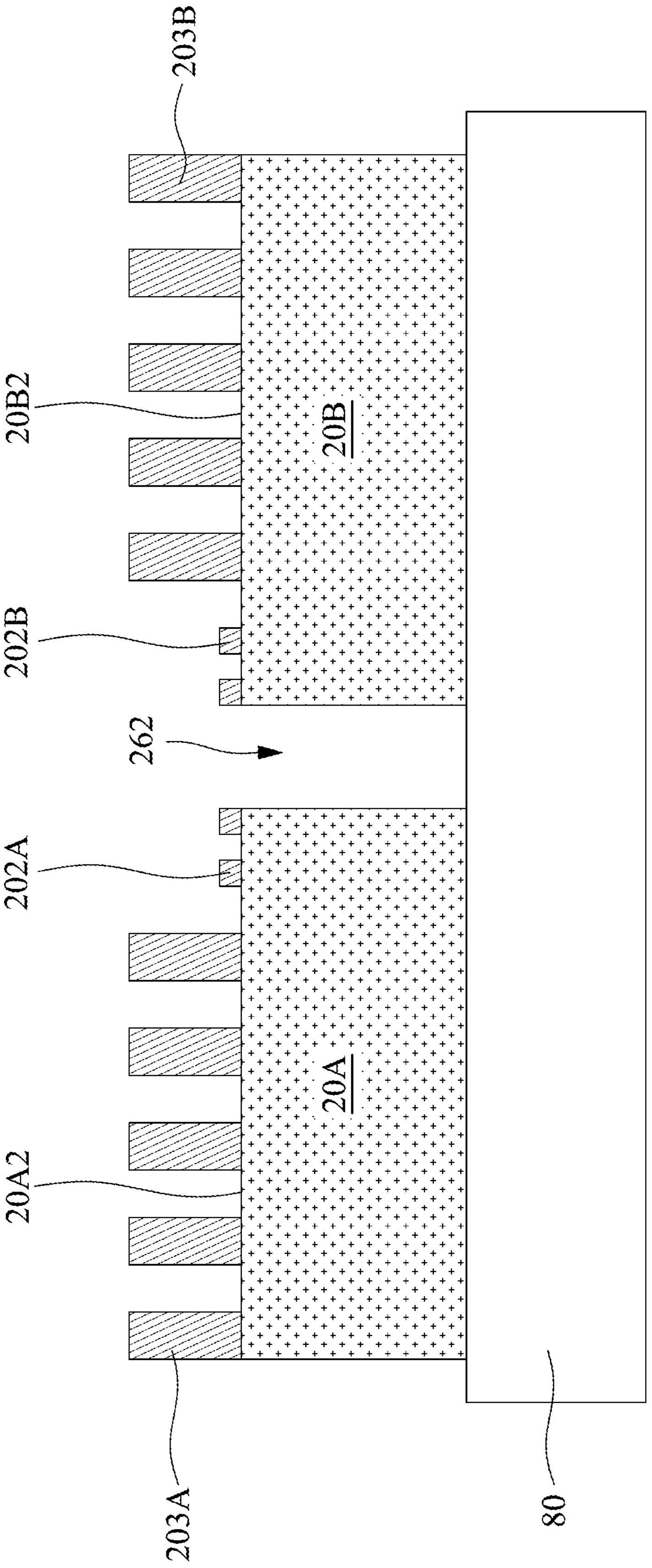

As shown in FIG. 5B, the electronic components, including the electronic component 20A and the electronic component 20B, are disposed side by side on a carrier 80 in a reconstitution process. The surface 20A2 of the electronic component 20A and the surface 20B2 of the electronic component 20B face away from the carrier 80. The electronic component 20A is spaced apart from the electronic component 20B by a gap.

Figure 5C:
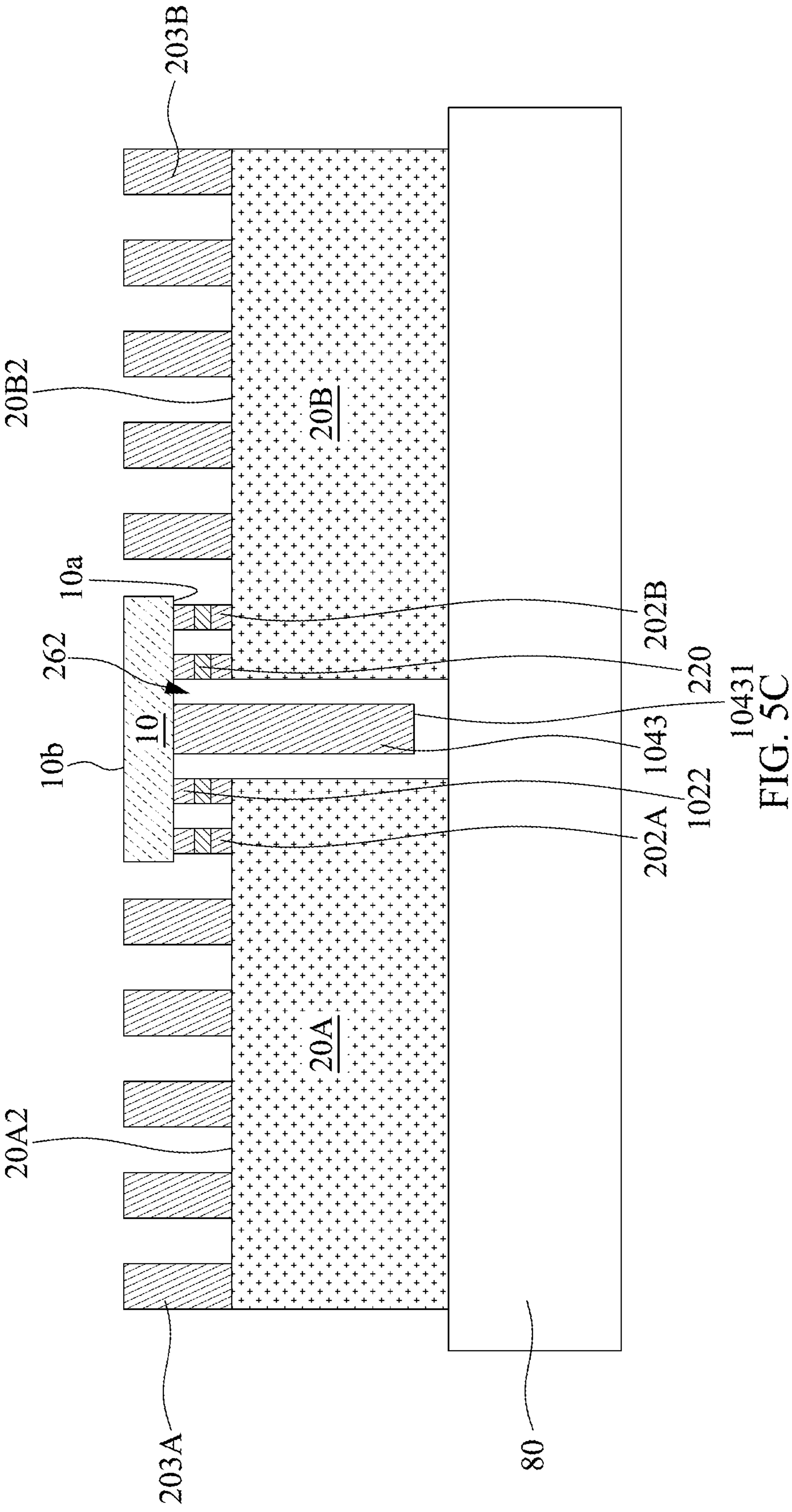

As shown in FIG. 5C, the bridge component(s), including the bridge component 10, are flip-chip bonded to the electronic components, including the electronic component 20A and the electronic component 20B. The surface 10*a* of the bridge component 10 faces the surface 20A2 of the electronic component 20A and the surface 20B2 of the electronic component 20B. The conductive pillar 1043 extends into the gap. The conductive pads 1022 are bonded to the conductive pads 202A and 202B, e.g., by the conductors 220.

Figure 5D:
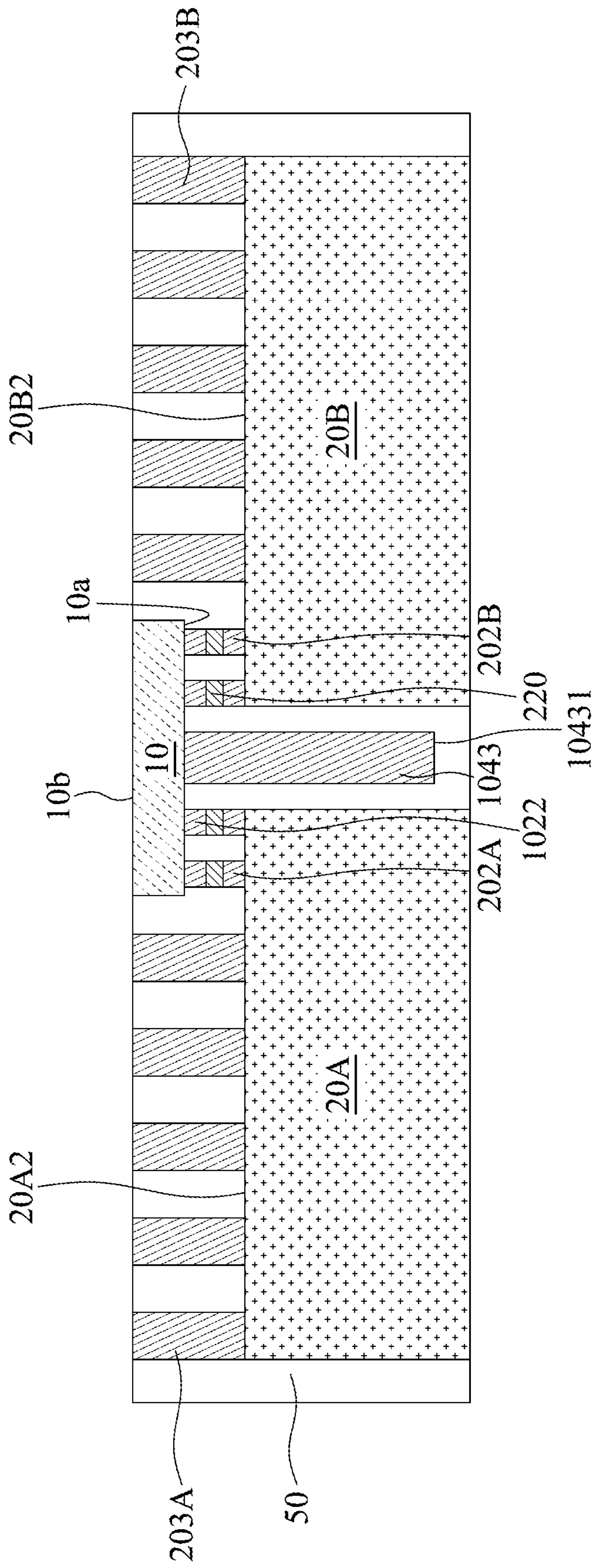

As shown in FIG. 5D, an encapsulant 50, such as a molding compound, is disposed to cover the electronic components 20A and 20B, the bridge component 10, the conductive pads 202A, 202B and 1022, the conductive pillar 1043, and the conductors 220. Excessive encapsulant may be removed by, for example, a grinding process, such that the conductive pillars 203A and 203B are exposed. In some arrangements, a surface 10*b* of the bridge component 10 may also exposed. The surface 10*b* of the bridge component 10 may be substantially coplanar with the exposed surfaces of the conductive pillars 203A and 203B. Subsequently, the carrier 80 is released.

Figure 5E:
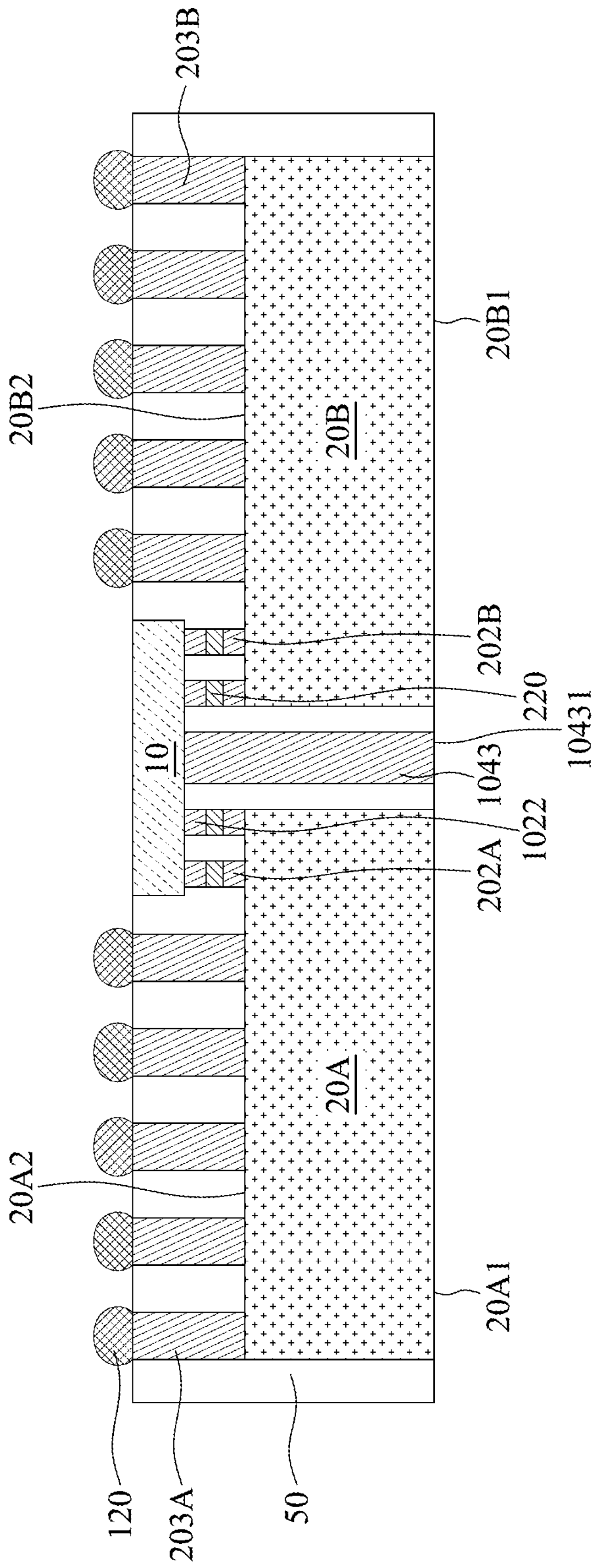

As shown in FIG. 5E, a removal process, such as a backside grinding process, is performed to expose the conductive pillar 1043. A surface 10431 of the conductive pillar 1043 is exposed. The surface 10431 of the conductive pillar 1043 is substantially coplanar with a surface 20A1 of the electronic component 20A and a surface 20B1 of the electronic component 20B. Conductors 120 are disposed on the conductive pillars 203A and 203B. The conductors 120 may be or include a solder material. The conductors 120 may be or include solder bumps. A package sawing process may be performed to singulate the package structure.

Figure 5F:
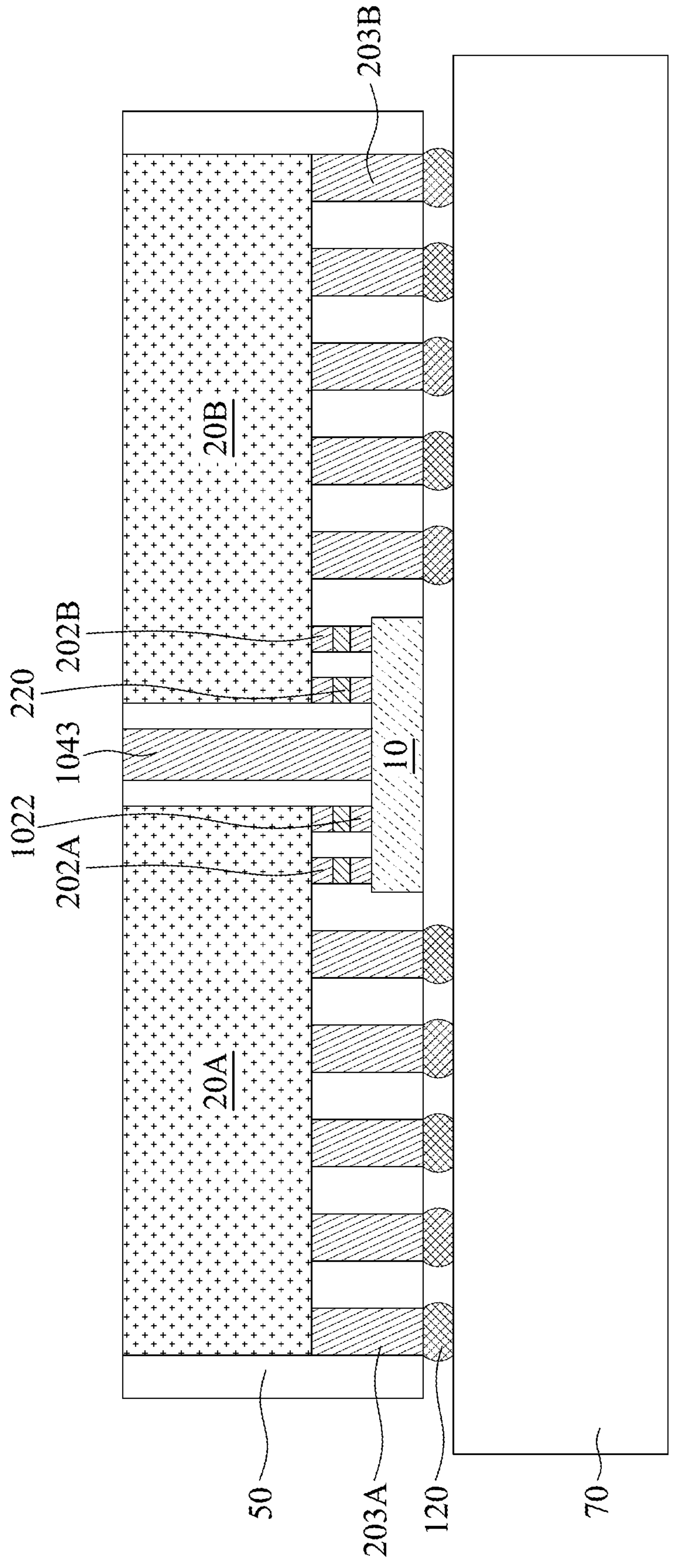

As shown in FIG. 5F, the package structure shown in FIG. 5E is flip-chip bonded to a substrate 70 by the conductors 120. The substrate 70 may be or include, a printed circuit board (PCB), such as a paper-based copper foil laminate, a composite copper foil laminate, or a polymer-impregnated glass-fiber-based copper foil laminate, or so on. The substrate 70 may be or include an interposer. The substrate 70 may be or include a fan-out substrate. Another electronic component(s), such as the electronic component 30A and/or 30B, may be disposed on the electronic component 20A and/or the electronic component 20B as shown in FIG. 1. The electronic component 30A and/or 30B may be bonded to the conductive pillar 1043, e.g., by a conductor. In some arrangements, a shielding component 55 may be disposed on the electronic component 20A and the electronic component 20B as shown in FIG. 3.

FIG. 6A, FIG. 6B, FIG. 6C, FIG. 6D, FIG. 6E and FIG. 6F illustrate various stages of a method for manufacturing a package structure in accordance with some arrangements of the present disclosure.

Figure 6A:
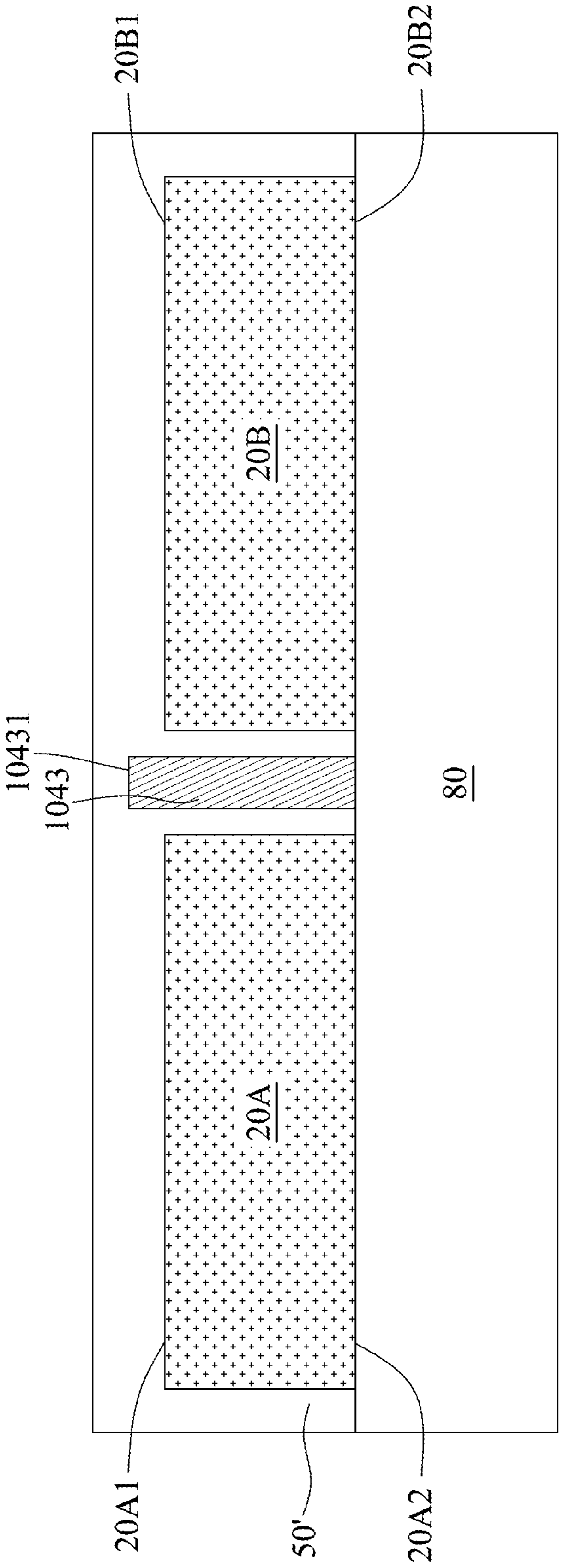
FIG. 6A, FIG. 6B, FIG. 6C, FIG. 6D, FIG. 6E and FIG. 6F illustrate various stages of a method for manufacturing a package structure in accordance with some arrangements of the present disclosure.
Figure 6B:
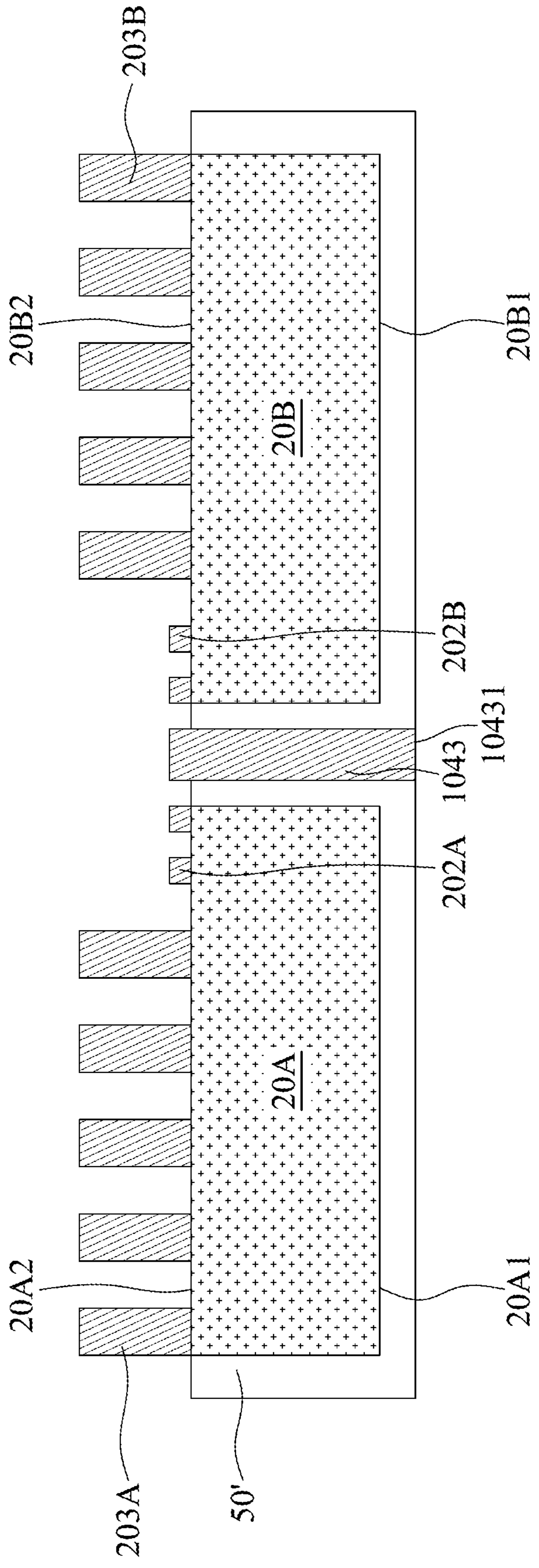
Figure 7A:
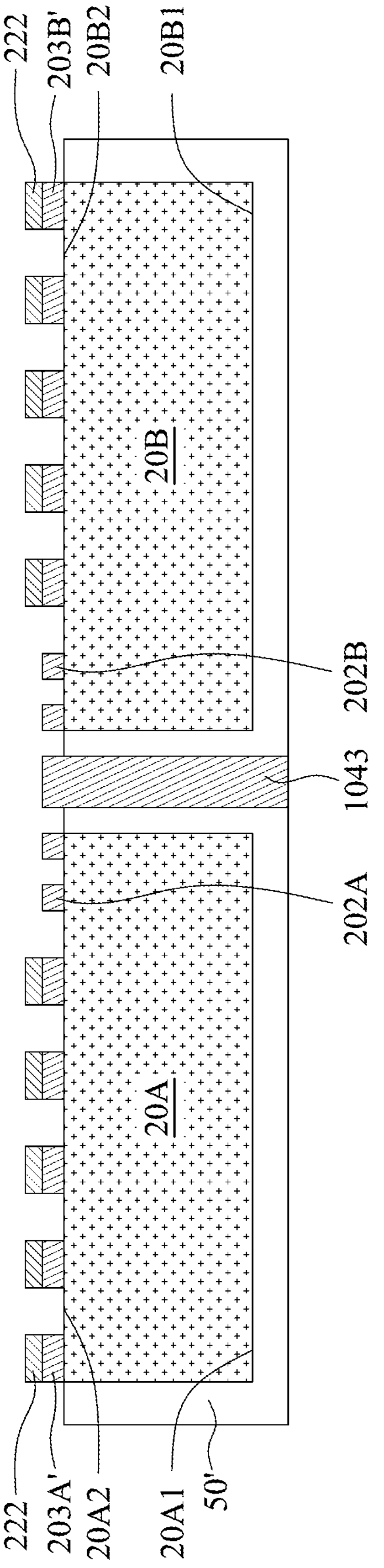
FIG. 7A, FIG. 7B, FIG. 7C and FIG. 7D illustrate various stages of a method for manufacturing a package structure in accordance with some arrangements of the present disclosure.

As shown in FIG. 6A, at least one conductive pillar 1043 is formed on a carrier 80. The conductive pillar 1043 may be formed by a plating process, such as an electroplating process. Electronic components, including an electronic component 20A and an electronic component 20B, are disposed side by side on the carrier 80 in a reconstitution process. A surface 20A2 (e.g., an active surface) of the electronic component 20A and a surface 20B2 (e.g., an active surface) of the electronic component 20B face the carrier 80. The conductive pillar 1043 is located between the electronic component 20A and the electronic component 20B. The conductive pillar 1043 may extend beyond a surface 20A1 of the electronic component 20A and/or a surface 20B1 of the electronic component 20B. A surface 10431 of the conductive pillar 1043 may be higher than the surface 20A1 of the electronic component 20A and/or the surface 20B1 of the electronic component 20B. An encapsulant 50', such as a molding compound, is disposed to cover the electronic components 20A and 20B and the conductive pillar 1043. Excessive encapsulant is removed by, for example, a grinding process, to expose the conductive pillar 1043 (as shown in FIG. 6B and FIG. 7A). The grinding process may be performed until the surface 10431 of the conductive pillar 1043 is exposed.

As shown in FIG. 6B, the carrier 80 is released. At least one conductive pad 202A and at least one conductive pillar 203A are formed on the surface 20A2 of the electronic component 20A. At least one conductive pad 202B and at least one conductive pillar 203B are formed on the surface 20B2 of the electronic component 20B.

Figure 6C:
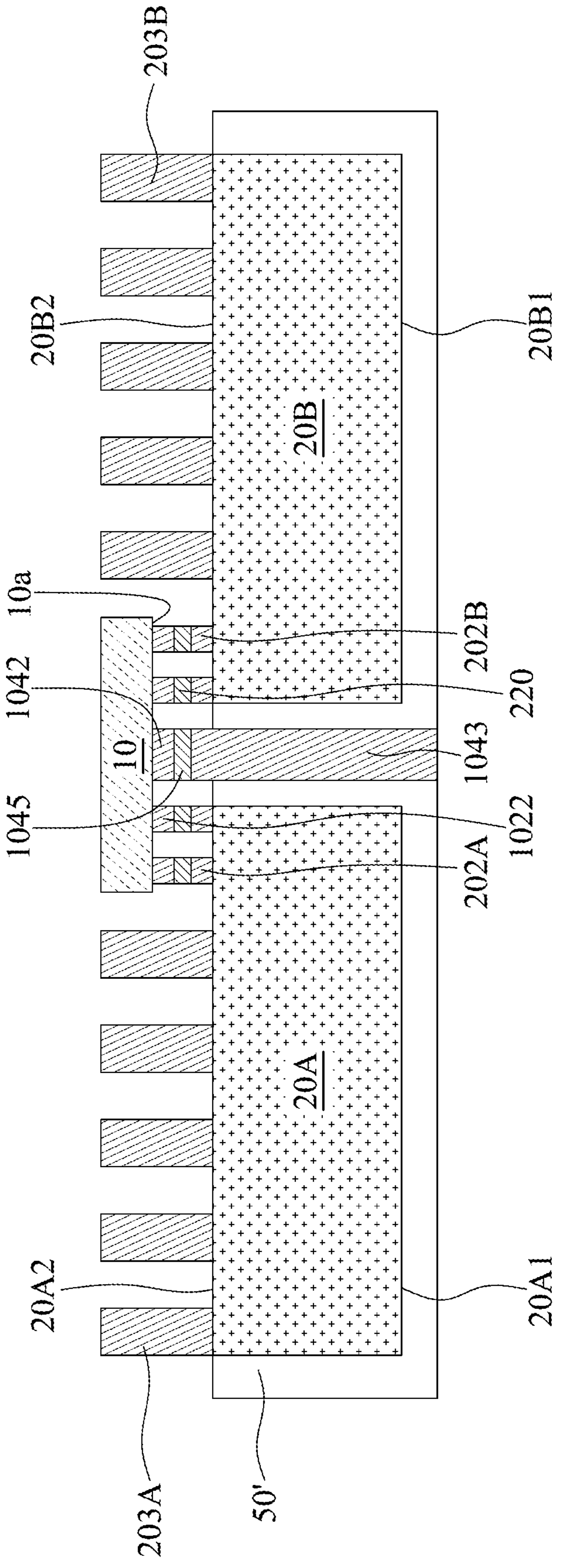

As shown in FIG. 6C, bridge components, including a bridge component 10, are flip-chip bonded to the electronic components including the electronic components 20A and 20B. The bridge component 10 includes at least one conductive pad 1022 and at least one conductive pad 1042 on a surface 10*a* (e.g., an active surface). The surface 10*a* of the bridge component 10 faces the surface 20A2 of the electronic component 20A and the surface 20B2 of the electronic component 20B. A width of the conductive pad 1042 may be greater than a width of the conductive pad 1022. The conductive pads 1022 are bonded to the conductive pads 202A and 202B by conductors 220. The conductive pad 1042 is bonded to the conductive pillar 1043 by a conductor 1045. The conductor 1045 may include the same material as the conductors 220. The conductors 220 and the conductor 1042 each may be or include a solder material. The conductors 220 and the conductor 1042 each may be or include solder bumps.

Figure 6D:
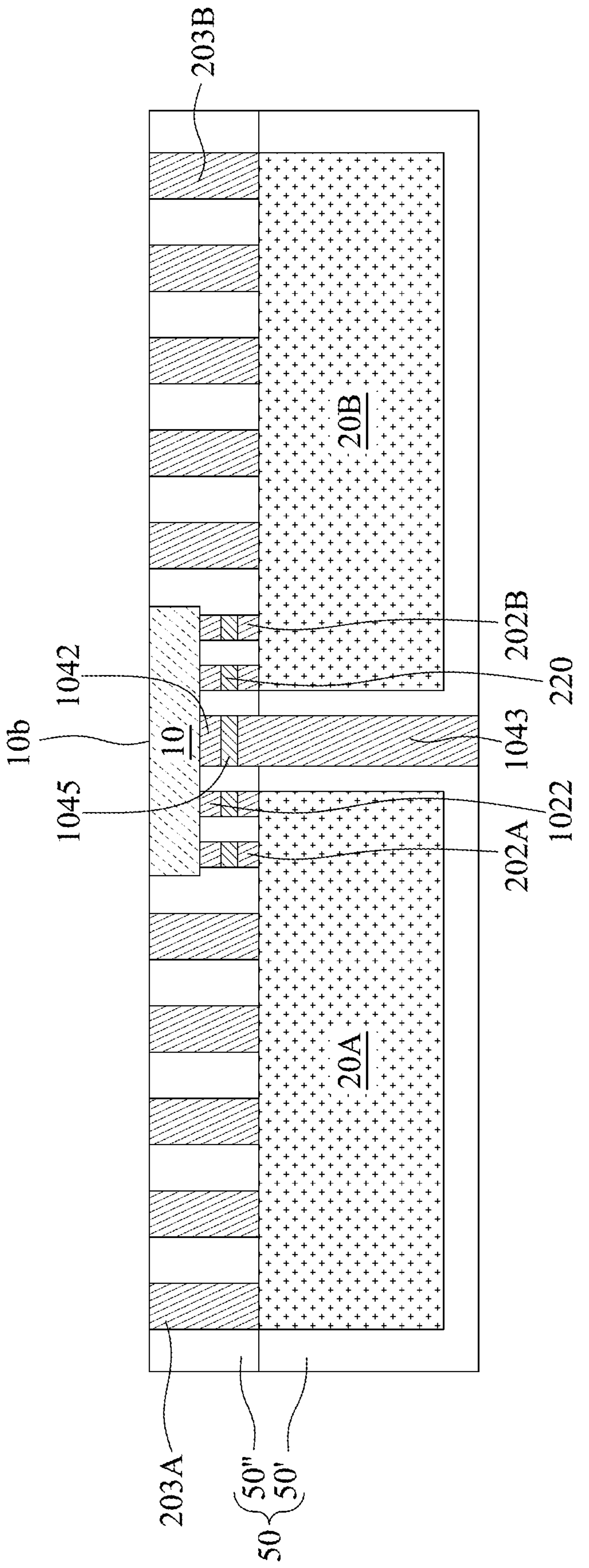

As shown in FIG. 6D, an encapsulant 50", such a molding compound, is disposed to cover the bridge component 10, the conductive pillars 203A and 203B, and the conductive pads 202A, 202B, 1022 and 1042, and the conductors 220 and 1045. Excessive encapsulant 50" is removed by, for example, a grinding process, to expose the conductive pillars 203A and 203B. In some arrangements, a surface 10*b* of the bridge component 10*b* may be also exposed. The surface 10*b* of the bridge component 10 may be substantially coplanar with the exposed surfaces of the conductive pillars 203A and 203B. The encapsulant 50' and the encapsulant 50" may be together referred to as an encapsulant 50. In some embodiments, the interface between the encapsulant 50' and the encapsulant 50" may not be clearly seen. In some embodiments, the encapsulant 50 may be formed integrally.

Figure 6E:
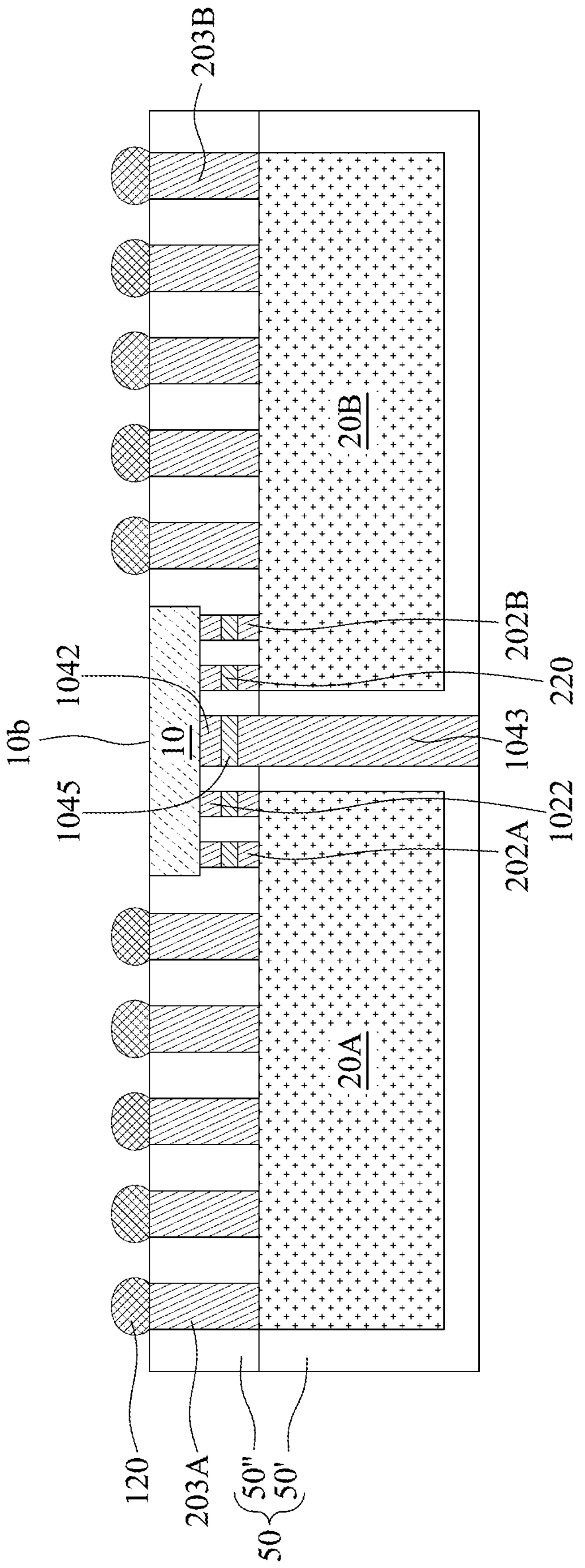

As shown in FIG. 6E, conductors 120 are disposed on the conductive pillars 203A and 203B. The conductors 120 may be or include a solder material. The conductors 120 may be or include solder bumps. A package sawing process may be performed to singulate the package structure.

Figure 6F:
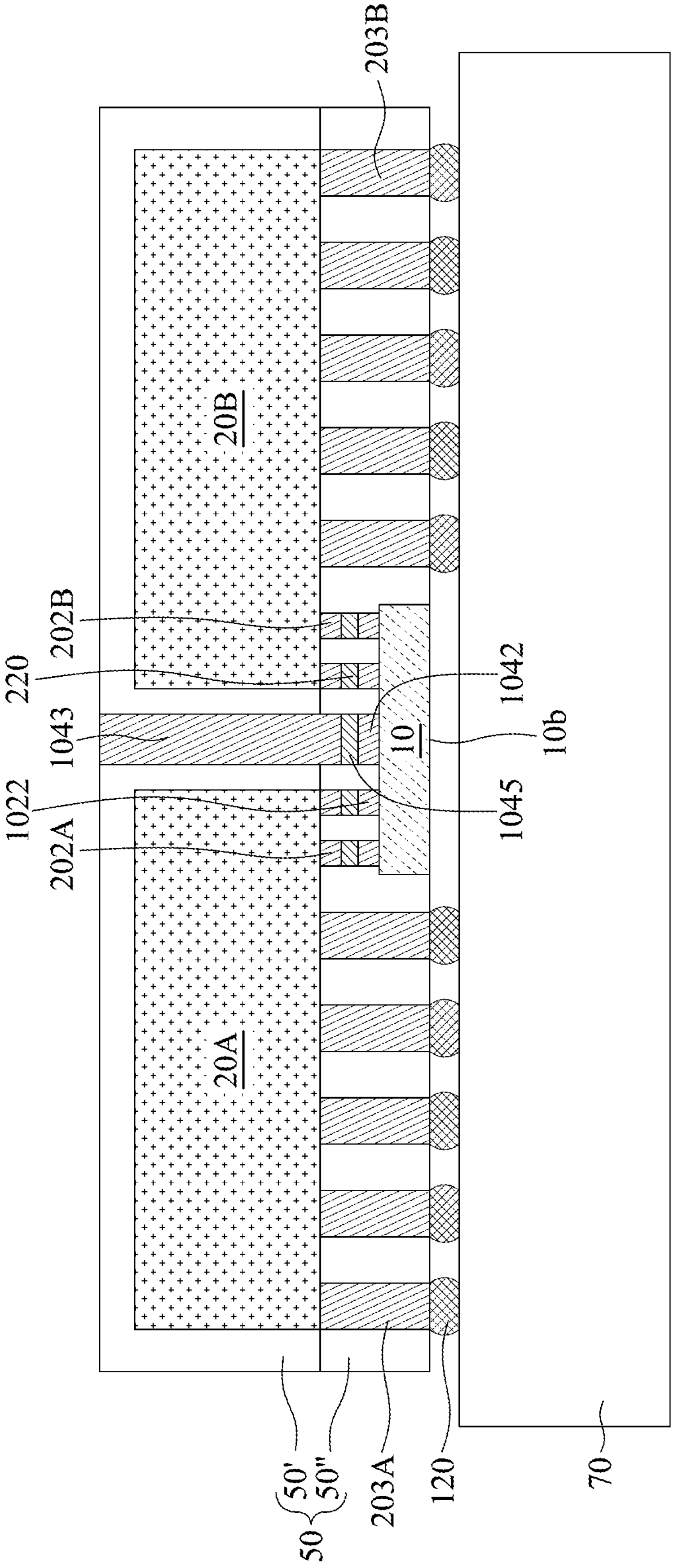

As shown in FIG. 6F, the package structure shown in FIG. 6E is flip-chip bonded to a substrate 70 by the conductors 120. Another electronic component(s), such as the electronic component 30A and/or 30B, may be disposed on the electronic component 20A and/or the electronic component 20B as shown in FIG. 1. The electronic component 30A and/or 30B may be bonded to the conductive pillar 1043, e.g., by a conductor. In some arrangements, a shielding component 55 may be disposed on the electronic component 20A and the electronic component 20B as shown in FIG. 3.

FIG. 7A, FIG. 7B, FIG. 7C and FIG. 7D illustrate various stages of a method for manufacturing a package structure in accordance with some arrangements of the present disclosure.

As shown in FIG. 7A, in some arrangements alternative to FIG. 6B, at least one conductive pad 202A and at least one conductive pad 203A' are formed on the surface 20A2 of the electronic component 20A. A width of the conductive pad 203A' may be greater than a width of the conductive pad 202A. At least one conductive pad 202B and at least one conductive pad 203B' are formed on the surface 20B2 of the electronic component 20B. A width of the conductive pad 203B' may be greater than a width of the conductive pad 202B. In some embodiments, conductors 222 may be disposed on the conductive pads 203A' and 203B'. The conductors 222 each may be or include a solder material. The conductors 222 each may be or include solder bumps.

Figure 7B:
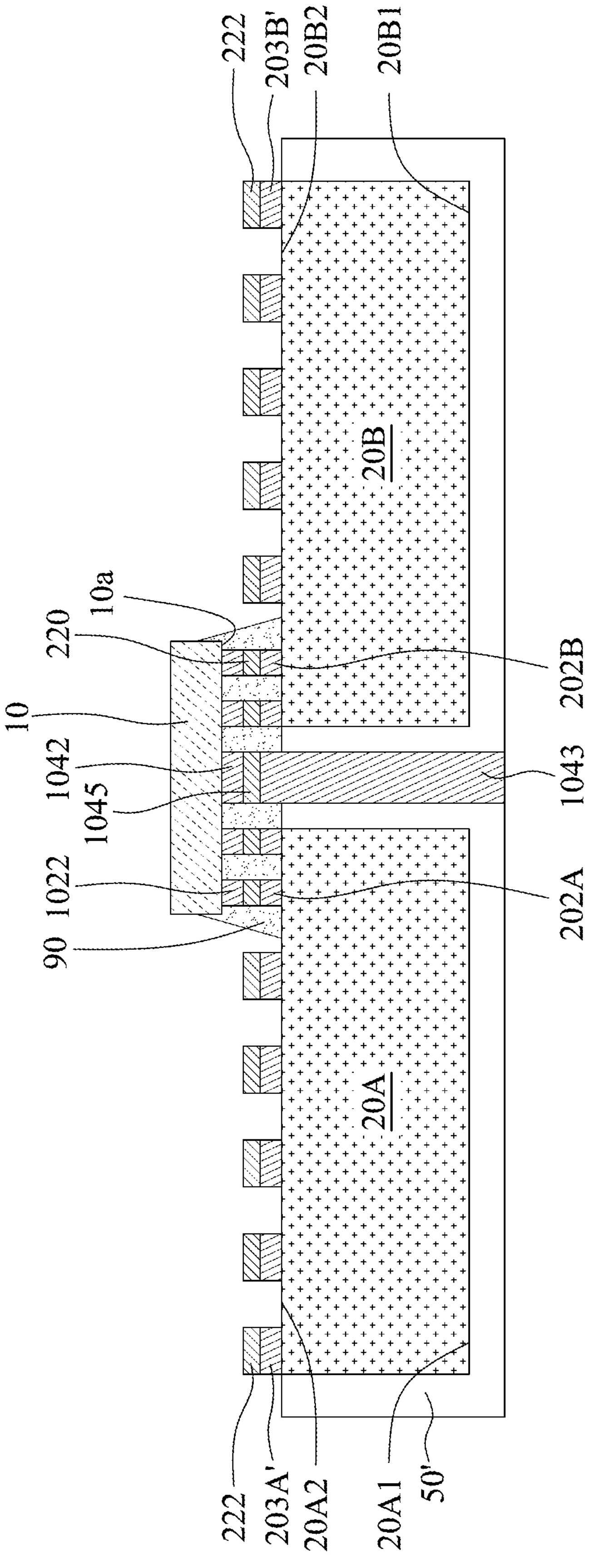

As shown in FIG. 7B, bridge components, including a bridge component 10, are flip-chip bonded to the electronic components, including the electronic components 20A and 20B. The bridge component 10 includes at least one conductive pad 1022 and at least one conductive pad 1042 on a surface 10*a* (e.g., an active surface). The surface 10*a* of the bridge component 10 faces the surface 20A2 of the electronic component 20A and the surface 20B2 of the electronic component 20B. A width of the conductive pad 1042 may be greater than a width of the conductive pad 1022. The conductive pads 1022 are bonded to the conductive pads 202A and 202B by conductors 220. The conductive pad 1042 is bonded to the conductive pillar 1043 by a conductor 1045. The conductor 1045 may include the same material as the conductors 220. The conductors 220 and the conductor 1042 each may be or include a solder material. The conductors 220 and the conductor 1042 each may be or include solder bumps. A filling structure 90 (e.g., an underfill structure) is formed between the bridge component 10 and the electronic components 20A and 20B to cover the conductive pads 202A, 202B, 1022 and 1042 and the conductors 220 and 1042. The filling structure includes a filling material. In some arrangements, the filling material may include an epoxy resin, a molding compound (e.g., an epoxy molding compound or other molding compound), polyimide, a phenolic compound or material, or other suitable materials, or a combination thereof.

Figure 7C:
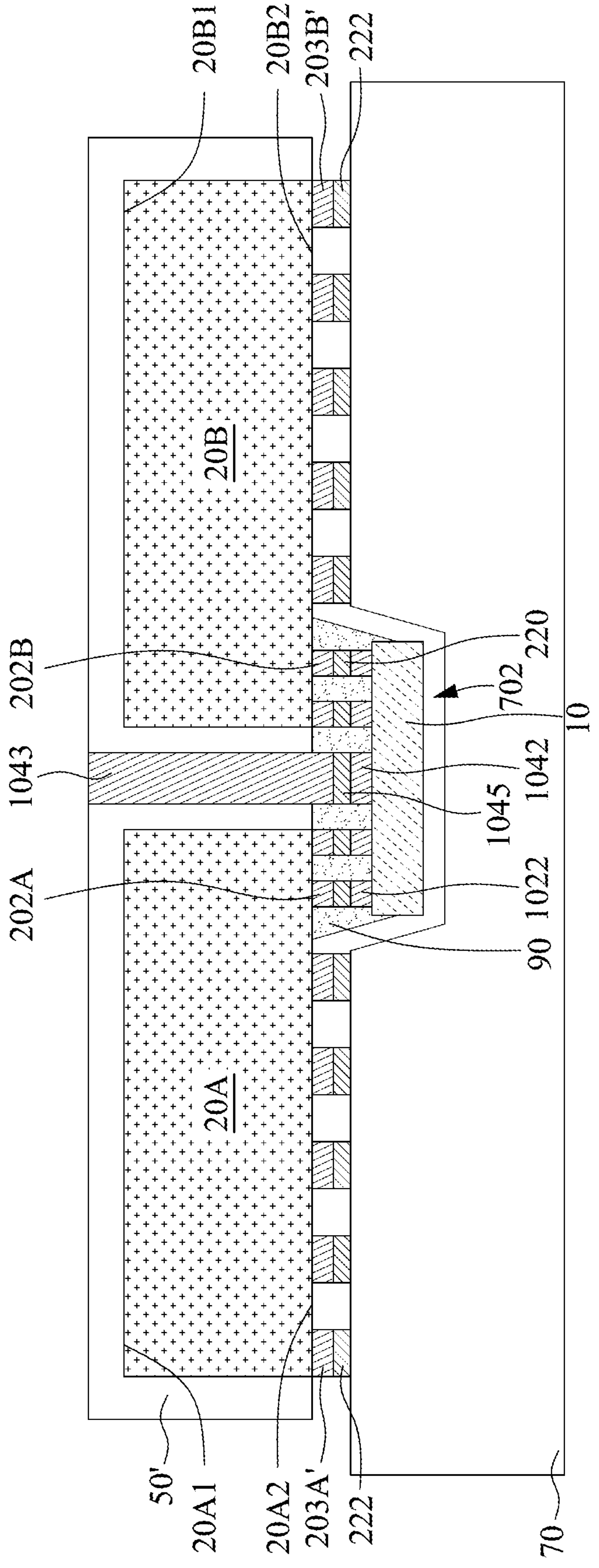
Figure 7D:
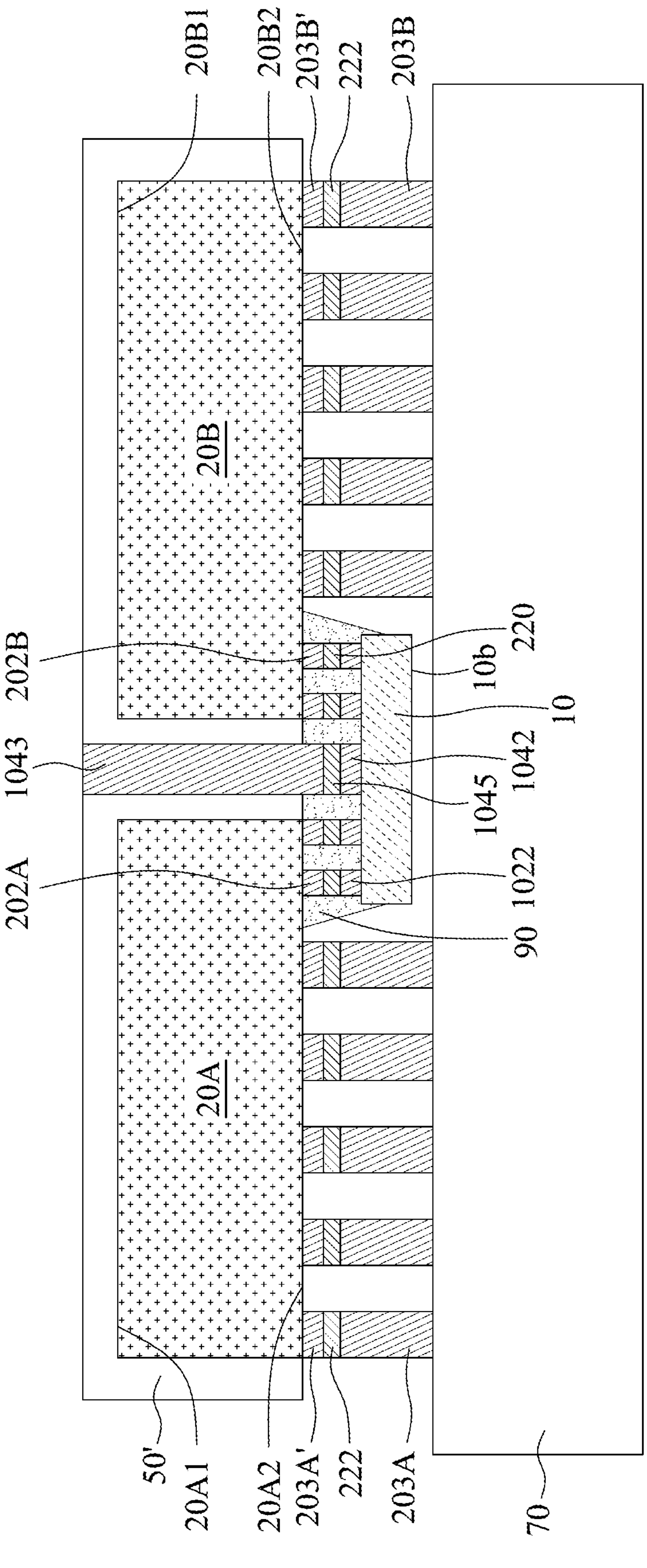

As shown in FIG. 7C, the package structure shown in FIG. 7B is flip-chip bonded to a substrate 70 by the conductors 222. The substrate may include conductive pads (not shown) bonded with the conductors 222. The substrate 70 includes a cavity 702. The bridge component 10 is accommodated in the cavity 702. In some alternative arrangements as shown in FIG. 7D, the substrate 70 includes at least one conductive pillar 203A and at least one conductive pillar 203B. The conductive pads 203A' are bonded to the conductive pillars 203A by the conductors 222. The conductive pads 203B' are bonded to the conductive pillars 203B by the conductors 222. The bridge component 10 has a surface 10*b* facing the substrate 70. The distance between the electronic component 20A (or the electronic component 20B) to the substrate 70 is greater than the distance between the surface 10*b* of the bridge component 10 to the substrate 70. Another electronic component(s), such as the electronic component 30A and/or 30B, may be disposed on the electronic component 20A and/or the electronic component 20B as shown in FIG. 1. The electronic component 30A and/or 30B may be bonded to the conductive pillar 1043, e.g., by a conductor. In some arrangements, a shielding component 55 may be disposed on the electronic component 20A and the electronic component 20B as shown in FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially parallel" can refer to a range of angular variation relative to 0° that is less than or equal to ±10°, such as less than or equal to ±5°, less than or equal to ±4°, less than or equal to ±3°, less than or equal to ±2°, less than or equal to #1°, less than or equal to ±0.5°, less than or equal to ±0.1°, or less than or equal to ±0.05°. For example, "substantially perpendicular" can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. In addition, a first surface of an object is "substantially level" with a second surface of another object if the first surface and the second surface are at the same plane within a variation of ±10%, such as ±5%, ±4%, ±3%, ±2%, ±1%, ±0.5%, ±0.1% or ±0.05%, of a height/length of the object.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between the highest point and the lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

While the present disclosure has been described and illustrated with reference to specific arrangements thereof, these descriptions and illustrations are not limiting. It should be understood by those skilled in the art that various changes may be made, and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:

an interposer comprising a first interconnector and a second interconnector, wherein the interposer comprises a first edge, a second edge opposite to the first edge, and an upper surface extending from the first edge to the second edge, and wherein the first interconnector and the second interconnector are disposed on the upper surface of the interposer;

a first electronic component over the upper surface of the interposer;

a second electronic component over the upper surface of the interposer; and a third electronic component over the upper surface of the interposer;

wherein the first electronic component and the second electronic component are disposed at a first horizontal level and electrically connected to each other through the first interconnector, wherein the second interconnector is electrically connected to the third electronic component disposed at a second horizontal level different from the first horizontal level, wherein a projection of the third electronic component in a horizontal direction does not overlap a projection of the first electronic component or second electronic component in the horizontal direction; and wherein a width of the interposer is less than a width of the first electronic component or a width of the second electronic component, wherein the first interconnector comprises a conductive pad having a first height protruding from the upper surface of the interposer, and the second interconnector comprises a conductive pillar having a second height protruding from the upper surface of the interposer, and wherein the second height is different from the first height, and both of the conductive pad and the conductive pillar are in contact with a solder material, and wherein the conductive pillar of the second interconnector extends along a lateral surface of the first electronic component, and a top surface of the conductive pillar of the second interconnector is substantially coplanar with a top surface of the first electronic component.

2. The package structure of claim 1, wherein the third electronic component is disposed over the first electronic component, and the second height is greater than the first height.

3. The package structure of claim 1, wherein the conductive pillar of the second interconnector extends into a gap between the first electronic component and the second electronic component.

4. The package structure of claim 1, wherein the first interconnector comprises a first transmission path, and the second interconnector comprises a second transmission path, and the second transmission path is not parallel to the first transmission path.

5. The package structure of claim 1, wherein the interposer further includes a lower surface opposite to the upper surface and the second interconnector comprises a conductive through via penetrating through the interposer from the upper surface to the lower surface, and the first interconnector comprises a conductive trace electrically connected to the conductive pad of the first interconnector to provide a horizontal transmission path.

6. The package structure of claim 1, wherein the second interconnector comprises a power transmission path and a signal transmission path, and the signal transmission path is located closer to the first or second electronic component than the power transmission path is.

7. The package structure of claim 6, wherein the second interconnector comprises a first conductive pillar for the power transmission path and a second conductive pillar for the signal transmission path, and wherein a width of the first conductive pillar is greater than a width of the second conductive pillar.

8. The package structure of claim 1, wherein the second interconnector comprises a first conductive pillar connected to a plurality of first conductive through vias penetrating through the interposer, and a second conductive pillar connected to a second conductive through via penetrating through the interposer.

9. A package structure, comprising:

a bridge interposer comprising a first edge, a second edge opposite to the first edge, an active surface extending from the first edge to the second edge, a plurality of conductive pads and at least one conductive pillar, wherein the plurality of conductive pads and at least one conductive pillar are disposed on the active surface, wherein a height of the at least one conductive pillar is greater than a height of the plurality of conductive pads;

a first electronic component and a second electronic component disposed at a first horizontal level and electrically connected to the plurality of conductive pads, wherein the bridge interposer is disposed under a gap between the first electronic component and the second electronic component;

a third electronic component disposed at a second horizontal level different from the first horizontal level and electrically connected to the at least one conductive pillar;

an encapsulant encapsulating the bridge interposer, the first electronic component, and the second electronic component, wherein a projection of the first electronic component in a vertical direction covers the first edge of the bridge interposer and a projection of the second electronic component in the vertical direction covers the second edge of the bridge interposer, wherein a backside surface of the bridge interposer opposite to the active surface of the bridge interposer is exposed from the encapsulant, and wherein the at least one conductive pillar extends into the gap, and an upper surface of the at least one conductive pillar is not lower than an upper surface of the first or second electronic component or both.

10. The package structure of claim 9, wherein the upper surface of the at least one conductive pillar is higher than the upper surface of the first or second electronic component or both.

11. The package structure of claim 9, wherein a width of the at least one conductive pillar is greater than a width of one of the plurality of conductive pads.

12. The package structure of claim 11, wherein the bridge interposer comprises a plurality of conductive through vias directly in contact with a first conductive pillar of the at least one conductive pillar, and wherein the first conductive pillar is configured for a power transmission path.

13. The package structure of claim 9, further comprising a passive component bonded to the first or second electronic component, wherein the passive component and the bridge interposer are disposed at substantially the same horizontal level, and a backside surface of the bridge interposer opposite to the active surface of the bridge interposer is substantially coplanar with a surface of the passive component.

14. The package structure of claim 13, wherein the passive component is located under the first or second electronic component.

15. The package structure of claim 13, wherein the passive component is located adjacent to a power pad of the first or second electronic component.

* * * * *